(12) United States Patent
Kobayashi

(10) Patent No.: US 7,548,130 B2
(45) Date of Patent: Jun. 16, 2009

(54) CHARACTERISTIC AUTOMATIC COMPENSATING APPARATUS, CHARACTERISTIC AUTOMATIC COMPENSATING METHOD, CHARACTERISTIC AUTOMATIC COMPENSATING PROGRAM OF OSCILLATOR AND POSITIONING SIGNAL RECEIVER

(75) Inventor: Michio Kobayashi, Okaya (JP)

(73) Assignee: Seiko Epson Corporation (JP)

( * ) Notice: Subject to any disclaimer, the term of this patent is extended or adjusted under 35 U.S.C. 154(b) by 279 days.

(21) Appl. No.: 10/547,058

(22) PCT Filed: Feb. 19, 2004

(86) PCT No.: PCT/JP2004/001872

§ 371 (c)(1),
(2), (4) Date: Oct. 11, 2006

(87) PCT Pub. No.: WO2004/084403

PCT Pub. Date: Sep. 30, 2004

(65) Prior Publication Data

US 2007/0035344 A1 Feb. 15, 2007

(51) Int. Cl.
*H03L 1/02* (2006.01)
(52) U.S. Cl. .................................. 331/176; 331/1 A
(58) Field of Classification Search .................. 331/1 A, 331/176, 70
See application file for complete search history.

(56) References Cited

U.S. PATENT DOCUMENTS

| 4,513,259 A | 4/1985 | Frerking et al. |
| 5,523,552 A | 6/1996 | Shellhammer |
| 2002/0180535 A1 | 12/2002 | Barak et al. |
| 2003/0036847 A1 | 2/2003 | Geier |

FOREIGN PATENT DOCUMENTS

| EP | 1221586 A | 7/2002 |
| JP | 6-291550 A | 10/1994 |
| JP | 8-212280 A | 8/1996 |
| JP | 8-271606 A | 10/1996 |
| JP | 2921435 | 4/1999 |
| JP | 2001-12952 A | 1/2001 |
| JP | 2002-58057 | 2/2002 |
| JP | 2002-303533 A | 10/2002 |

OTHER PUBLICATIONS

Communication from European Patent Office regarding corresponding application.
International Search Report; PCT/JP2004/001872; Feb. 19, 2004; ISA/JP.

*Primary Examiner*—Joseph Chang
(74) *Attorney, Agent, or Firm*—Harness, Dickey & Pierce, P.L.C.

(57) ABSTRACT

A characteristic automatic compensating apparatus of an oscillator includes oscillating means, temperature detecting means, characteristic determining means for measuring a drift value of an oscillating frequency while changing the temperature and for determining a coefficient of an approximated equation representing temperature and the drift value, storing means for storing the coefficient, drift value predicting means, and characteristic updating means for updating the coefficient by the measured drift value of the oscillating frequency and the temperature, wherein the characteristic determining means represents the approximated equation representing the characteristic of the temperature detected by the temperature detecting means and the drift value of the oscillating frequency of the oscillating means by a polynomial.

17 Claims, 11 Drawing Sheets

CHARACTERISTIC AUTOMATIC COMPENSATING APPARATUS, CHARACTERISTIC AUTOMATIC COMPENSATING METHOD, CHARACTERISTIC AUTOMATIC COMPENSATING PROGRAM OF OSCILLATOR AND POSITIONING SIGNAL RECEIVER

TECHNICAL FIELD

The present invention relates to a characteristic automatic compensating method, a characteristic automatic compensating method and a characteristic automatic compensating program of an oscillator and a positioning signal receiver for automatically compensating for a change in a characteristic of the oscillator.

BACKGROUND ART

There is known a positioning signal receiver of a background art in which from a temperature detected by a temperature sensor installed at a vicinity of a temperature compensating type quartz transmitter (TCXO), a drift amount of an oscillating frequency of TCXO is predicted, and a center frequency of a frequency range for searching a positioning signal from a satellite is shifted by the predicted drift amount.

However, according to the above-described positioning signal receiver of the background art, when the drift amount D of the oscillating frequency of TCXO at temperatures T ($T_k < T < T_{k+1}$) detected by the temperature sensor is predicted, based on a drift amount $D_k$ at a temperature $T_k$ and a drift amount $D_{k+1}$ at a temperature $T_{k+1}$ stored to a memory, as shown by FIG. 18, a straight line α connecting two points is calculated, the drift amount D is predicted by using the straight line α, a relationship between the temperature and the drift amount is approximated by a polygonal line and therefore, there poses an unresolved problem that a temperature frequency characteristic of TCXO is not pertinently represented and the drift amount cannot be predicted with high accuracy.

Hence, the invention has been carried out by paying attention to the unresolved problem of the above-described background art, and it is an object thereof to provide a characteristic automatic compensating apparatus, a characteristic automatic compensating method, a characteristic automatic compensating program and a positioning signal receiver capable of predicting a drift amount of an oscillating frequency of TCXO with higher accuracy.

DISCLOSURE OF THE INVENTION

A characteristic automatic compensating apparatus of an oscillator according to the invention is characterized in comprising oscillating means for outputting an oscillating signal depending on a physical amount provided with an oscillating frequency, physical amount detecting means for detecting the physical amount provided to the oscillating means, characteristic determining means for measuring a drift value of the oscillating frequency of the oscillating means while changing the physical amount and for previously determining a coefficient of an approximated equation representing a characteristic of the physical amount detected by the physical amount detecting means and the drift value of the oscillating frequency, storing means for storing the coefficient of the approximated equation determined by the characteristic determining means, drift value predicting means for predicting the drift value of the oscillating frequency of the oscillating means based on the physical amount detected by the physical amount detecting means, and characteristic updating means for updating the coefficient of the approximated equation determined by the characteristic determining means by the measured drift value of the oscillating frequency of the oscillating means and the physical amount detected by the physical amount detecting means at a time point of the detection.

Thereby, the previously determined coefficient of the approximated equation representing the characteristic of the reference oscillator is updated based on the measured drift value and the physical amount at a time point of the detection and therefore, a change in the characteristic by an aging change or the like can accurately be followed and the frequency drift value can be predicted always with high accuracy.

Further, a characteristic automatic compensating apparatus of an oscillator according to the invention is characterized in comprising oscillating means for outputting an oscillating signal an oscillating frequency of which depends on a temperature, temperature detecting means for detecting the temperature of the oscillating means, characteristic determining means for measuring a drift value of the oscillating frequency of the oscillating means while changing the temperature and for previously determining a coefficient of an approximated equation representing a temperature frequency characteristic of the temperature detected by the temperature detecting means and the drift value of the oscillating frequency of the oscillating means, storing means for storing the coefficient of the approximated equation determined by the characteristic determining means, drift value predicting means for predicting the drift value of the oscillating frequency of the oscillating means based on the temperature detected by the temperature detecting means, and characteristic updating means for updating the coefficient of the approximated equation determined by the characteristic determining means by the measured drift value of the oscillating frequency of the oscillating means and the temperature detected by the temperature detecting means at a time point of the detection.

Thereby, the previously determined coefficient of the approximated equation representing the temperature frequency characteristic of the reference oscillator is updated based on the measured drift value and data of the temperature and therefore, a change in the temperature frequency characteristic by an aging change or the like can accurately be followed and the frequency drift value can be predicted always with high accuracy.

Further, the invention is characterized in that the temperature detecting means is constituted by a temperature compensating type oscillator.

Thereby, a change in the temperature can be determined by measuring a change in the frequency of the temperature compensating type oscillator and therefore, a change in the temperature of the reference oscillator arranged at a vicinity thereof can easily be detected.

Further, the invention is characterized in that the characteristic determining means represents the approximated equation representing the characteristic of the temperature detected by the temperature detecting means and the drift value of the oscillating frequency of the oscillating means by a polynomial.

Thereby, a temperature frequency characteristic curve of the oscillator can be approximated with high accuracy and therefore, accuracy of predicting the frequency drift value can be promoted.

Further, the invention is characterized in that the characteristic determining means represents the approximated equation representing the characteristic of the temperature detected by the temperature detecting means and the drift value of the oscillating frequency of the oscillating means by the polynomial of a degree of 5 or more.

Thereby, the temperature frequency characteristic curve of the oscillator can be approximated with high accuracy of within a residual of ±0.1 ppm and therefore, the accuracy of predicting the frequency drift value can be promoted.

Further, the invention is characterized in that the characteristic determining means represents the approximated equation representing the characteristic of the temperature detected by the temperature detecting means and the drift value of the oscillating frequency of the oscillating means by the polynomial by either of a least squares method and a successive least squares method.

Thereby, the coefficient of the approximate equation representing the temperature frequency characteristic of the oscillator can easily be calculated based on a set of measured data of the data of the temperature and the frequency drift value.

Further, the invention is characterized in that the characteristic determining means represents the approximated equation representing the characteristic of the temperature detected by the temperature detecting means and the drift value of the oscillating frequency of the oscillating means by the polynomial by a Kalman filter.

Thereby, the coefficient of the approximated equation representing the temperature frequency characteristic of the oscillator can easily be calculated based on the set of the measured data of the data of the temperature and the frequency drift value.

Further, the invention is characterized in that the characteristic updating means updates all of the coefficients of the polynomial determined by the characteristic determining means.

Thereby, a change in the temperature frequency of characteristic of the oscillator by the aging change or the like can accurately be followed and therefore, the frequency drift value can be predicted always with the predicting accuracy within ±0.1 ppm.

Further, the invention is characterized in that the characteristic updating means updates all of the coefficients of the polynomial determined by the characteristic determining means by either one of the least squares method and the successive least squares method by dividing a temperature range at constant intervals with regard to a temperature range which is not detected by the temperature detecting means, calculating the drift value by the polynomial determined by the characteristic determining means for each divided temperature and forming a set of data of the temperature and the drift value, and using the provided set of the data and a set of data of the measured drift value of the oscillating frequency of the oscillating means and the temperature detected by the temperature detecting means at the time point of the detection.

Thereby, with regard to outside of the detected temperature range, the drift value is calculated from the polynomial curve before updating, the coefficient of the polynomial curve is updated by using the calculated value and therefore, in comparison with a case of updating by using only data within the detected temperature range, a deterioration in the predicting accuracy of outside of the detected temperature range can be restrained, and the memory can considerably be reduced and a problem of overflowing is not posed.

Further, the invention is characterized in that the characteristic updating means updates all of the coefficients of the polynomial determined by the characteristic determining means by the Kalman filter by dividing a temperature range at constant intervals with regard to a temperature range which is not detected by the temperature detecting means, forming a set of data of the temperature and the drift value by calculating the drift value by the coefficient of the polynomial determined by the characteristic determining means for each divided temperature, and using the provided set of the data and a set of data of the measured drift value of the oscillating frequency of the oscillating means and the temperature detected by the temperature detecting means at the time point of the detection.

Thereby, with regard to outside of the detected temperature range, the drift value is calculated from the polynomial curve before updating, the coefficient of the polynomial curve is updated by using the calculated value and therefore, in comparison with the case of updating by using only data within the detected temperature range, a deterioration in the predicting accuracy of outside of the detected temperature range can be restrained and the memory can considerably be reduced.

Further, the invention is characterized in that the oscillating means is constituted by an oscillator of a gyro sensor.

Thereby, by updating the coefficient of the approximated polynomial representing the characteristic curve of the oscillating frequency of the gyro sensor, an amount of drift of the oscillating frequency of the gyro sensor can be corrected and detecting accuracy of the gyro sensor can be promoted.

Further, the invention is characterized in that the measured drift value of the oscillating frequency of the oscillating means is measured based on a reference frequency of a global positioning system.

Thereby, the drift value of the oscillating frequency of the gyro sensor is measured by comparing the reference frequency of the global positioning system and the oscillating frequency of the gyro sensor and therefore, a change in the temperature frequency characteristic of the oscillator by an aging change or the like can accurately be followed and the drift value can be predicted always with high accuracy.

Further, the invention is characterized in that the measured drift value of the oscillating frequency of the oscillating means is measured based on a carrier frequency of a base station of a portable telephone.

Thereby, the drift value of the oscillating frequency of the gyro sensor is measured by comparing the carrier frequency of the base station of the portable telephone and the oscillating frequency of the gyro sensor and therefore, the change in the temperature frequency characteristic of the oscillator by the aging change or the like can accurately be followed and the drift value can be predicted always with high accuracy.

Further, a characteristic automatic compensating method of an oscillator according to the invention is characterized in comprising a step of measuring a frequency drift value of an oscillating signal outputted from oscillating means and measuring a temperature of the oscillating means by temperature detecting means while changing the temperature and of determining a coefficient of an approximated equation representing a temperature frequency characteristic of the frequency drift value of the oscillating means and a data of the temperature measured by temperature detecting means, a step of storing the determined coefficient of the approximated equation to storing means and predicting the drift value of the oscillating frequency of the oscillating means based on the data of the temperature measured by the temperature detecting means and the coefficient of the approximated equation stored to the storing means, and a step of updating the coefficient of the approximated equation stored to the storing means by the measured drift value of the oscillating frequency of the oscillating means and the temperature at a time point of the detection.

Thereby, the previously determined coefficient of the approximated equation representing the temperature frequency characteristic of the oscillator is updated based on the measured drift value and the data of the temperature and therefore, the change in the temperature frequency characteristic by the aging change or the like can accurately be followed and the drift value can be predicted always with high accuracy.

Further, a characteristic automatic compensating program of an oscillator according to the invention is characterized in a characteristic automatic compensating program of an oscillator for automatically compensating for a characteristic of an oscillator for making a computer execute a step of measuring a frequency drift value of an oscillating signal outputted from oscillating means and measuring a temperature of the oscillating means by temperature detecting means while changing the temperature and of determining a coefficient of an approximated equation representing a temperature frequency characteristic of the frequency drift value of the oscillating means and a data of the temperature measured by the temperature detecting means, a step of storing the determined coefficient of the approximated equation to storing means and predicting the drift value of the oscillating frequency of the oscillating means based on the data of the temperature measured by the temperature detecting means and the coefficient of the approximated equation stored to the storing means, and a step of updating the coefficient of the approximated equation stored to the storing means by the measured drift value of the oscillating frequency of the oscillating means and the temperature at a time point of the detection.

Thereby, the previously determined coefficient of the approximated equation representing the temperature frequency characteristic of the oscillator is updated based on the measured drift value and the data of the temperature and therefore, a change in the temperature frequency characteristic by the aging change can accurately be followed and the frequency drift value can be predicted always with high accuracy.

Further, a positioning signal receiver according to the invention is characterized in comprising oscillating means for outputting an oscillating signal an oscillating frequency of which depends on a temperature, temperature detecting means for detecting the temperature of the oscillating means, characteristic determining means for measuring a drift value of the oscillating frequency of the oscillating means while changing the temperature and of previously determining a coefficient of an approximated equation representing a temperature frequency characteristic of the temperature detected by the temperature detecting means and the drift value of the oscillating frequency of the oscillating means, storing means for storing the coefficient of the approximated equation determined by the characteristic determining means, drift value predicting means for predicting the drift value of the oscillating frequency of the oscillating means based on the temperature detected by the temperature detecting means, and characteristic updating means for updating the coefficient of the approximated equation determined by the characteristic determining means by the measured drift value of the oscillating frequency of the oscillating means provided by positioning and the temperature detected by the temperature detecting means at a time point of the positioning.

Thereby, the previously determined coefficient of the approximated equation representing the temperature frequency characteristic of the oscillator is updated based on the measured drift value provided by positioning and the data of the temperature and therefore, the change in the temperature frequency characteristic by the aging change or the like can accurately be followed and the frequency drift value can be predicted always with high accuracy.

BRIEF DESCRIPTION OF THE DRAWINGS

FIG. 14 illustrates explanatory diagrams of updating a coefficient of an approximated polynomial according to the third embodiment.

BEST MODE FOR CARRYING OUT THE INVENTION

An embodiment of the invention will be explained in reference to the drawings as follows.

Figure 1:
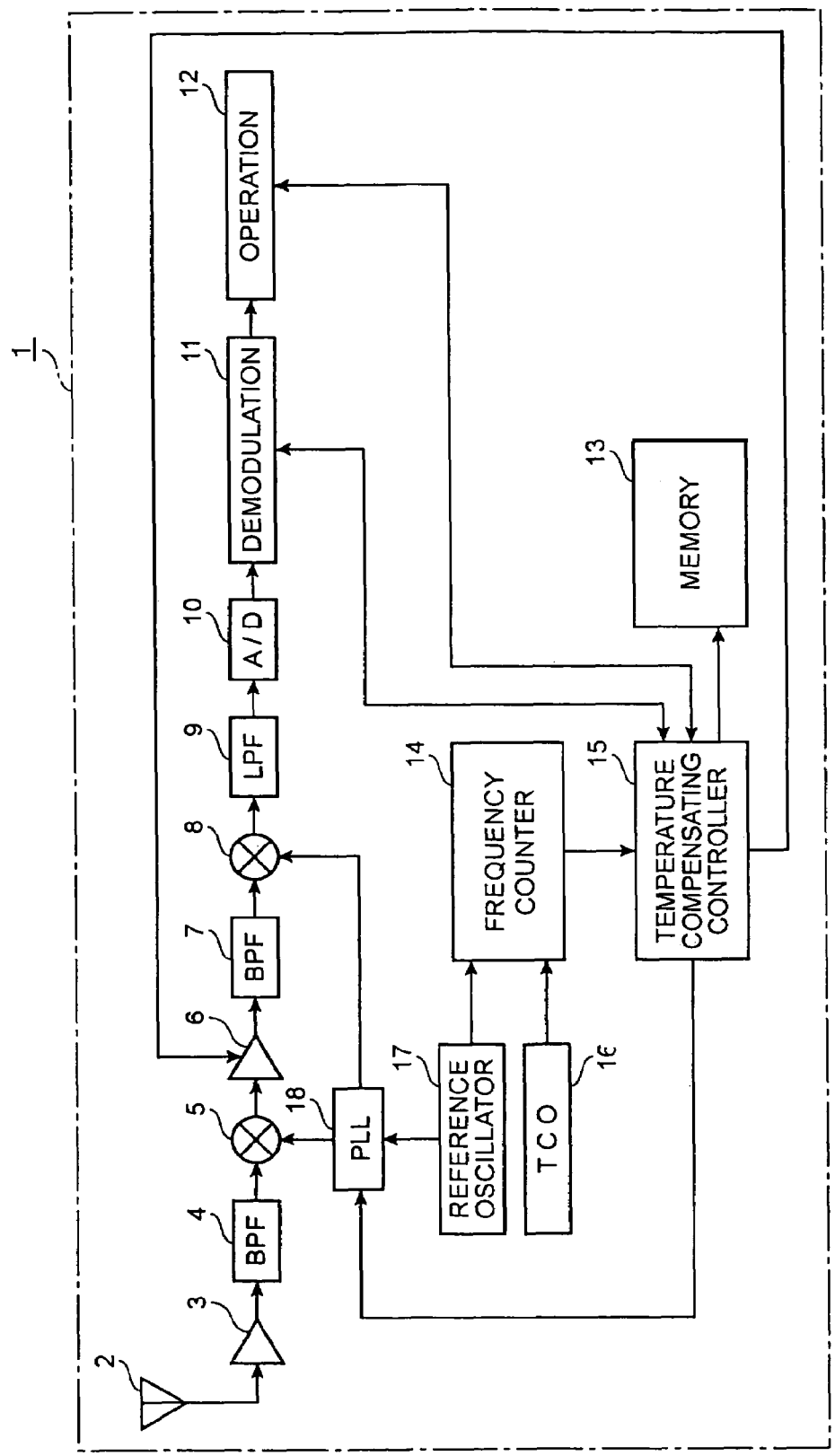
FIG. 1 is an outline constitution diagram showing an embodiment of the invention.

FIG. 1 is an outline constitution diagram showing an embodiment of a case of applying the invention to a receiver of a global positioning system (hereinafter, referred to as GPS) using an artificial satellite, numeral 1 in the drawing designates a GPS receiver, and the GPS receiver 1 is provided with an antenna 2 for receiving a GPS signal constituted by a spectrum diffusing signal from an artificial satellite.

The GPS signal received by the antenna 2 is amplified by a low noise amplifier 3, thereafter, inputted to a mixer 5 via a band path filter (BPF) 4, mixed with a frequency signal outputted by a PLL circuit (phase locked loop circuit) 18 by the mixer 5, and the receiving signal at a predetermined frequency (1.5 GHz band) is downconverted (frequency conversion) to a first intermediate frequency signal.

In this case, the frequency signal outputted by the PLL circuit 18 is a signal formed by dividing a substantially constant frequency signal outputted by a reference oscillator 17 as oscillating means by a diving circuit in the PLL circuit 18. Further, the frequency of the signal outputted by the PLL circuit 18 can be changed by controlling a dividing ratio or the like and an oscillating frequency of the PLL circuit 18 can be controlled by a temperature compensating controller 15.

As the reference oscillator 17, there is used a quartz oscillator of a type referred to as SPXO without temperature compensation, or a quartz oscillator of a type referred to as TCXO including temperature compensation.

Next, the first intermediate frequency signal outputted by the mixer 5 is amplified to a predetermined amplitude by an AGC (auto gain control) amplifier 6. An amplifying rate in that case is controlled by the temperature compensating controller 15 in accordance with a situation of a demodulating portion 11.

A signal outputted by the AGC amplifier 6 is inputted to a mixer 8 via a band path filter 7. The mixer 8 mixes a constant frequency signal (lower than the frequency inputted to the mixer 5) outputted by the PLL circuit 18 to the first intermediate frequency signal to down convert to a second intermediate frequency signal.

Further, the second intermediate frequency signal outputted by the mixer 8 is passed through a low pass filter (LPF) 9, thereafter, converted by A/D conversion via an A/D converter 10, inputted to at the demodulating portion 11 and subjected to a demodulating processing of the GPS signal. At the demodulating portion 11, a spectrum inverse diffusion processing by multiplying the A/D-converted second intermediate frequency signal by a PN code (quasi random code) and a processing of demodulating transmitting data by BPSK demodulation of the signal subjected to the spectrum inverse diffusion are executed to provide data (ephemeris data, almanac data, GPS time data and the like) transmitted from the satellite. In this case, the PN code used in the spectrum inverse diffusion processing is constituted by a value determined for each satellite and a satellite to be used for reception can be selected by selecting the PN code. The satellite to be used for reception is selected by controlling by the temperature compensating controller 15. Further, the demodulating portion 11 is made to be able to execute the demodulating processing simultaneously with from 8 channels to 16 channels at maximum. Therefore, positioning signals of a plurality of satellites can simultaneously be received to demodulate.

Further, transmitting data from respective satellites provided by demodulating the data by the demodulating portion 11 is inputted to an operation processing portion 12, based on the transmitting data, time periods of propagating signals from respective satellites are calculated, and information with regard to correcting values (convection sphere correcting value, ionosphere correcting value, correcting value of GPS time) necessary for calculating positions of respective satellites and distances between the satellites and the receiver is provided. Based on the provided information, the position of the receiver and corrected time of GPS time of the receiver are calculated.

In this case, there are three unknowns of (x, y, z) in the position of the receiver and therefore, it is necessary to calculate four unknowns including the correcting time t of GPS time of the receiver. Therefore, normally, satellite data of four or more is normally needed.

When a number of the satellites is four, four simultaneous equations are formed from the corrected data of the distances between the respective satellites and the receiver and the corrected position data of the respective satellites, and by solving the simultaneous equations, the position of the receiver, and the corrected value of GPS time of the receiver (offset value from GPS time) can be calculated. Further, at the operation processing portion 12, a drift amount of an oscillating frequency of the reference oscillator 17 is measured when signals from the respective satellites are caught and the current position can be positioned.

Further, in a vicinity of the reference oscillator 17 is arranged a temperature compensating type oscillator (hereinafter, referred to as TCO (Temperature complemented oscillator)) 16 as temperature detecting means.

TCO 16 is an RC oscillating circuit using a resistor referred to as thermistor a resistance value of which is changed by temperature, and a frequency thereof is changed by temperature. A change in the frequency in correspondence with a change in a temperature of the reference oscillator 17 is detected by determining the frequency signal inputted to a frequency counter 14 by the temperature compensating controller 15. The temperature compensating controller 15 calculates a polynomial of m degree representing a temperature frequency characteristic of the frequency of TCO 16 and a frequency drift value of the reference oscillator 17 by using the frequency drift amount of the reference oscillator 17 measured by GPS positioning inputted from the operation processing portion 12 and the frequency of TCO 16 in positioning. By recording (m+1) coefficients of the calculated polynomial to a memory 13 as storing means, the previously stored coefficients of the polynomial are updated.

Figure 2:
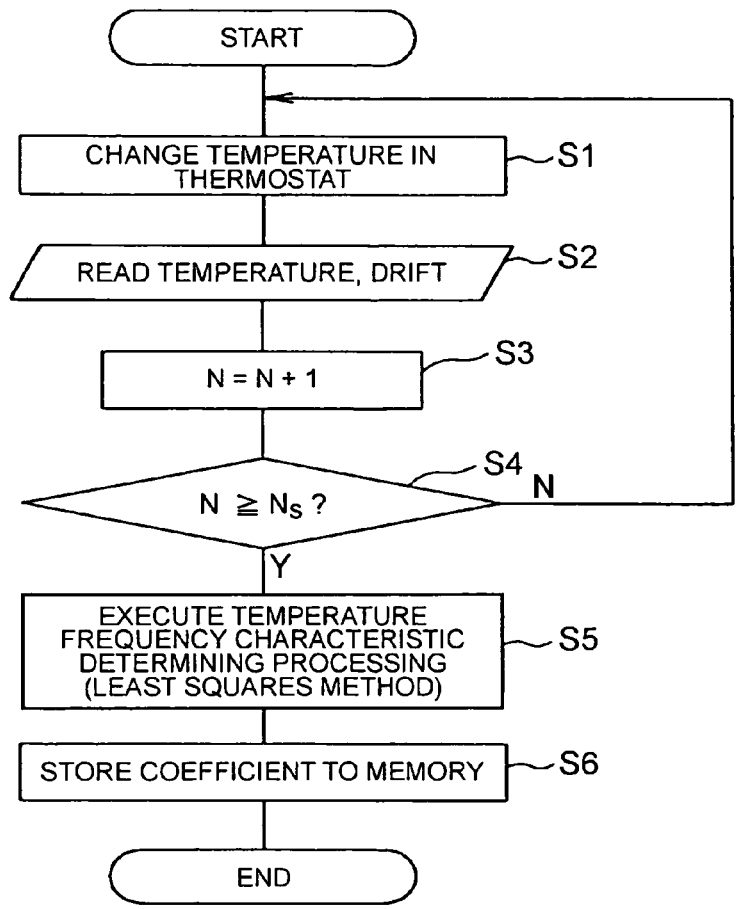
FIG. 2 is a flowchart showing a processing of determining a temperature frequency characteristic of a temperature compensating controller 15 of FIG. 1 according to a first embodiment.

FIG. 2 is a flowchart showing a processing of determining a temperature frequency characteristic executed by the temperature compensating controller 15 according to a first embodiment. The temperature frequency characteristic determining processing determines a coefficient of an approximated equation (m degree polynomial) representing a temperature frequency characteristic between the frequency of TCO 16 and the frequency drift of the reference oscillator 17 previously stored to the memory 13.

First, the GPS receiver 1 for testing is put into a thermostat constituting a temperature variable apparatus capable of receiving the GPS signal, a temperature in the thermostat is changed at step S1, successively, the operation proceeds to step S2 to measure a frequency $f_T$ of TCO 16 and a drift value of the reference oscillator 17.

Successively, the operation proceeds to step S3 to increment a data acquiring number count value N for measuring a number of acquired data and proceeds to step S4 to determine whether the count value N is equal to or larger than a data acquiring number set value $N_s$. The data acquiring number set value $N_s$ is set to a number of data capable of determining a further accurate temperature frequency characteristic (for example, about 5000).

When a result of determination at step S4 is $N<N_s$, it is determined that the number of data for determining the further accurate temperature frequency characteristic is not reached and the operation proceeds to the step S1. On the other hand, when $N \geq N_s$, the operation proceeds to step S5 to calculate a coefficient of a temperature frequency characteristic curve based on sets of provided N data of the frequencies $f_T$ of TCO 16 and the frequency drift values of the reference oscillator 17.

Figure 3:
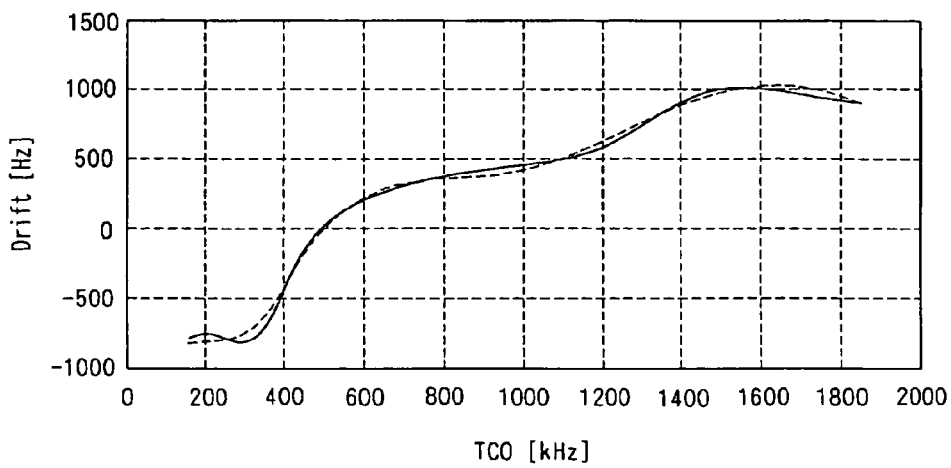
FIG. 3 shows a frequency characteristic of a frequency of TCO and a drift value of a reference oscillator.

Here, when a temperature range which can be used by the GPS receiver 1 falls in a range of −25° C. through 60° C., the frequencies $f_T$ of TCO 16 in correspondence with the temperatures become 200 kHz through 1800 kHz. A bold line shown in FIG. 3 shows a relationship between measured values of the frequency $f_T$ of TCO 16 and the drift value of the reference oscillator 17 in the temperature range of −25° C. through 60° C.

Figure 4:
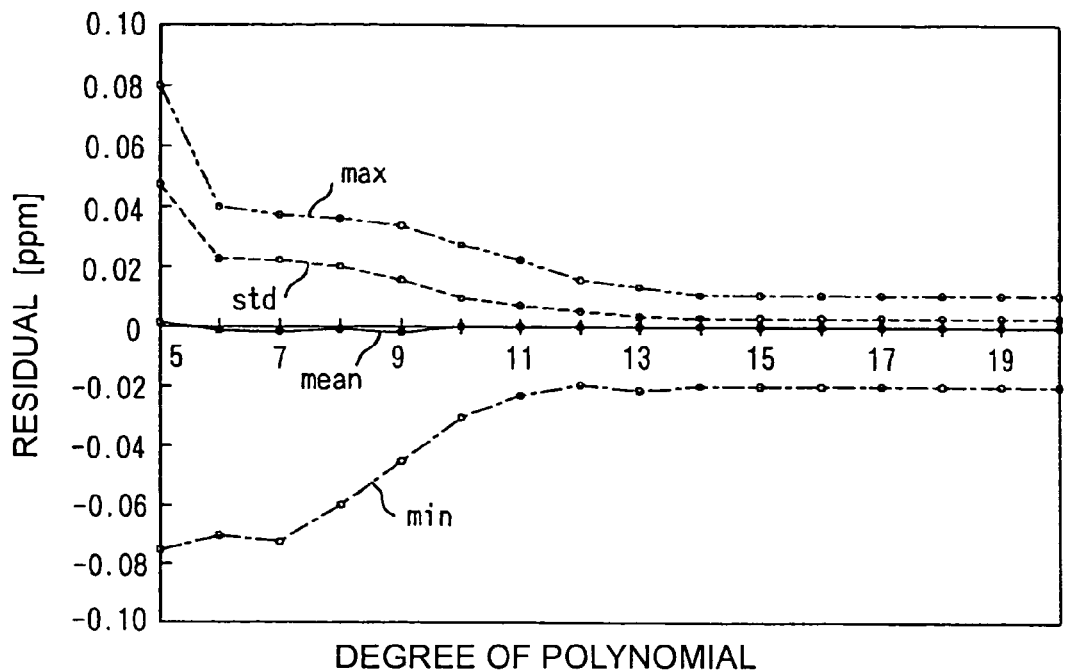
FIG. 4 is a relationship diagram of a degree number of an approximated polynomial and a residual.

When the relationship between the frequency and the drift value is approximated by an m degree polynomial, although a residual of the measured value of the drift value and an approximated value by the polynomial can be restrained to within ±0.1 ppm when the degree of the polynomial is equal to or larger than 5 as shown by FIG. 4, when the degree is equal to or smaller than 4, the residual cannot be restrained within ±0.1 ppm and approximating accuracy of the polynomial is deteriorated. Further, even when the degree of the polynomial is increased to be equal to or larger than 11, the residual is not improved. Further, in FIG. 4, notation min indicated by a one-dotted chain line designates a minimum residual, notation max indicated by a two-dotted chain line designates a maximum residual, notation std indicated by a broken line designates a standard deviation, and notation mean indicated by a bold line designates a mean value.

Therefore, when the temperature frequency characteristic curve of the frequency of TCO 16 and the frequency drift value of the reference oscillator 17 is approximated by a 9 degree polynomial, as shown by FIG. 4, the residual of the measured value of drift and the approximated value by the polynomial can be restrained within ±0.05 ppm, and only 10 coefficients of the polynomial may be stored to the memory 13.

Hence, an explanation will be given of a case of approximating the temperature frequency characteristic curve of the frequency and the drift value by, for example, a 9 degree polynomial.

In the case in which the frequency of TCO 16 is designated by notation x and the frequency drift value of the reference oscillator 17 is designated by notation y, when a set of the frequency and the measured value of the drift value is designated by notation $(x_i, y_i)$, it is assumed that the temperature frequency characteristic curve can be approximated by a 9 degree polynomial of the following equation.

$$f(a, x) = a_0 + a_1 x + a_2 x^2 + \ldots + a_9 x^9 \quad (1)$$

When coefficients of Equation (1), mentioned above, are calculated, by designating a residual of a certain measured point $(x_i, y_i)$ and the approximated equation is designated by notation $\epsilon_i$ ($= y_i - f(a, x_i)$), there may be calculated a for minimizing ($=0$) a square sum of the residual coefficient $\epsilon_i$ partially differentiated by respective coefficients $a_k$ ($k=0, \ldots, 9$) of the approximated polynomial. This is a solution method of a least squares method.

$$-2 \sum_{i=1}^{N} \{y_i - f(a, x_i)\} \frac{\partial f(a, x_i)}{\partial a_k} = 0 (k = 0, \cdots, 9) \therefore \sum_{i=1}^{N} \{y_i - f(a, x_i)\} x_i^k \quad (2)$$
$$= 0 (k = 0, \cdots, 9)$$

Therefore, the approximated polynomial y=f(a, x) can be calculated by calculating $a_i(N)$ (i=0, . . . , 9) by solving Equation (3), shown below, proceeded by rearranging Equation (2).

$$\begin{bmatrix} \sum_{i=1}^{N} x_i^0 & \sum_{i=1}^{N} x_i^1 & \sum_{i=1}^{N} x_i^2 & \sum_{i=1}^{N} x_i^3 & \sum_{i=1}^{N} x_i^4 & \sum_{i=1}^{N} x_i^5 & \sum_{i=1}^{N} x_i^6 & \sum_{i=1}^{N} x_i^7 & \sum_{i=1}^{N} x_i^8 & \sum_{i=1}^{N} x_i^9 \\ \sum_{i=1}^{N} x_i^1 & \sum_{i=1}^{N} x_i^2 & \sum_{i=1}^{N} x_i^3 & \sum_{i=1}^{N} x_i^4 & \sum_{i=1}^{N} x_i^5 & \sum_{i=1}^{N} x_i^6 & \sum_{i=1}^{N} x_i^7 & \sum_{i=1}^{N} x_i^8 & \sum_{i=1}^{N} x_i^9 & \sum_{i=1}^{N} x_i^{10} \\ \sum_{i=1}^{N} x_i^2 & \sum_{i=1}^{N} x_i^3 & \sum_{i=1}^{N} x_i^4 & \sum_{i=1}^{N} x_i^5 & \sum_{i=1}^{N} x_i^6 & \sum_{i=1}^{N} x_i^7 & \sum_{i=1}^{N} x_i^8 & \sum_{i=1}^{N} x_i^9 & \sum_{i=1}^{N} x_i^{10} & \sum_{i=1}^{N} x_i^{11} \\ \sum_{i=1}^{N} x_i^3 & \sum_{i=1}^{N} x_i^4 & \sum_{i=1}^{N} x_i^5 & \sum_{i=1}^{N} x_i^6 & \sum_{i=1}^{N} x_i^7 & \sum_{i=1}^{N} x_i^8 & \sum_{i=1}^{N} x_i^9 & \sum_{i=1}^{N} x_i^{10} & \sum_{i=1}^{N} x_i^{11} & \sum_{i=1}^{N} x_i^{12} \\ \sum_{i=1}^{N} x_i^4 & \sum_{i=1}^{N} x_i^5 & \sum_{i=1}^{N} x_i^6 & \sum_{i=1}^{N} x_i^7 & \sum_{i=1}^{N} x_i^8 & \sum_{i=1}^{N} x_i^9 & \sum_{i=1}^{N} x_i^{10} & \sum_{i=1}^{N} x_i^{11} & \sum_{i=1}^{N} x_i^{12} & \sum_{i=1}^{N} x_i^{13} \\ \sum_{i=1}^{N} x_i^5 & \sum_{i=1}^{N} x_i^6 & \sum_{i=1}^{N} x_i^7 & \sum_{i=1}^{N} x_i^8 & \sum_{i=1}^{N} x_i^9 & \sum_{i=1}^{N} x_i^{10} & \sum_{i=1}^{N} x_i^{11} & \sum_{i=1}^{N} x_i^{12} & \sum_{i=1}^{N} x_i^{13} & \sum_{i=1}^{N} x_i^{14} \\ \sum_{i=1}^{N} x_i^6 & \sum_{i=1}^{N} x_i^7 & \sum_{i=1}^{N} x_i^8 & \sum_{i=1}^{N} x_i^9 & \sum_{i=1}^{N} x_i^{10} & \sum_{i=1}^{N} x_i^{11} & \sum_{i=1}^{N} x_i^{12} & \sum_{i=1}^{N} x_i^{13} & \sum_{i=1}^{N} x_i^{14} & \sum_{i=1}^{N} x_i^{15} \\ \sum_{i=1}^{N} x_i^7 & \sum_{i=1}^{N} x_i^8 & \sum_{i=1}^{N} x_i^9 & \sum_{i=1}^{N} x_i^{10} & \sum_{i=1}^{N} x_i^{11} & \sum_{i=1}^{N} x_i^{12} & \sum_{i=1}^{N} x_i^{13} & \sum_{i=1}^{N} x_i^{14} & \sum_{i=1}^{N} x_i^{15} & \sum_{i=1}^{N} x_i^{16} \\ \sum_{i=1}^{N} x_i^8 & \sum_{i=1}^{N} x_i^9 & \sum_{i=1}^{N} x_i^{10} & \sum_{i=1}^{N} x_i^{11} & \sum_{i=1}^{N} x_i^{12} & \sum_{i=1}^{N} x_i^{13} & \sum_{i=1}^{N} x_i^{14} & \sum_{i=1}^{N} x_i^{15} & \sum_{i=1}^{N} x_i^{16} & \sum_{i=1}^{N} x_i^{17} \\ \sum_{i=1}^{N} x_i^9 & \sum_{i=1}^{N} x_i^{10} & \sum_{i=1}^{N} x_i^{11} & \sum_{i=1}^{N} x_i^{12} & \sum_{i=1}^{N} x_i^{13} & \sum_{i=1}^{N} x_i^{14} & \sum_{i=1}^{N} x_i^{15} & \sum_{i=1}^{N} x_i^{16} & \sum_{i=1}^{N} x_i^{17} & \sum_{i=1}^{N} x_i^{18} \end{bmatrix} \quad (3)$$

$$\begin{bmatrix} a_0(N) \\ a_1(N) \\ a_2(N) \\ a_3(N) \\ a_4(N) \\ a_5(N) \\ a_6(N) \\ a_7(N) \\ a_8(N) \\ a_9(N) \end{bmatrix} = \begin{bmatrix} \sum_{i=1}^{N} y_i x_i^0 \\ \sum_{i=1}^{N} y_i x_i^1 \\ \sum_{i=1}^{N} y_i x_i^2 \\ \sum_{i=1}^{N} y_i x_i^3 \\ \sum_{i=1}^{N} y_i x_i^4 \\ \sum_{i=1}^{N} y_i x_i^5 \\ \sum_{i=1}^{N} y_i x_i^6 \\ \sum_{i=1}^{N} y_i x_i^7 \\ \sum_{i=1}^{N} y_i x_i^8 \\ \sum_{i=1}^{N} y_i x_i^9 \end{bmatrix}$$

That is, the coefficients of the approximated polynomial of the temperature frequency characteristic can be calculated by designating the sets of the measured values of the frequencies and the drift values by notation $(x_i, y_i)$, putting the GPS receiver 1 to the thermostat, measuring the frequencies of TCO 16 and the frequency drift values of the reference oscillator 17 while changing the temperature, and applying the least squares method to the provided sets of data.

Next, the operation proceeds to step S6 to store 10 coefficients $a_0(N)$ through $a_9(N)$ represented by 62 bits of the calculated 9 degree polynomial to the memory 13 to finish the temperature frequency characteristic determining processing.

In FIG. 2, the processing at step S5 corresponds to the characteristic determining means.

In this way, the 9 degree approximated polynomial calculated by the least squares method is as shown by a broken line of FIG. 3 and the residual from the measured value can be restrained within ±0.05 ppm.

Figure 5:
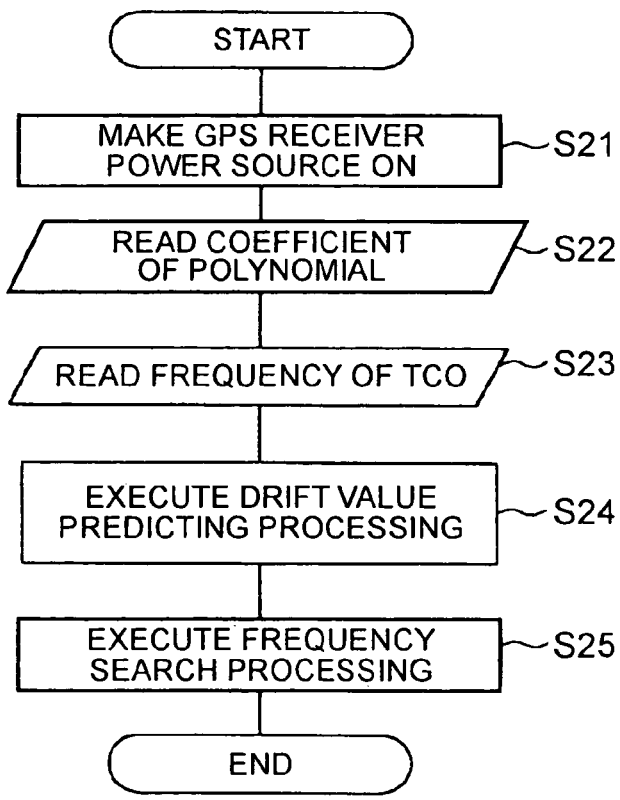
FIG. 5 is a flowchart showing a processing of searching a frequency of the temperature compensating controller 15 of FIG. 1.

Further, when positioning signals from respective satellites are caught, a frequency searching processing shown in FIG. 5 is executed by the temperature compensating controller 15.

According to the frequency searching processing, first, the operation sets a power source switch of the GPS receiver 1 to an ON state at step S21 and proceeds to step S22 to read the coefficients $a_0$ through $a_9$ of the approximated polynomial previously stored to the memory 13. Successively, the operation proceeds to step S23 to read the frequency of TCO 16 to detect the frequency in correspondence with a current temperature.

Further, the operation proceeds to step S24 to predict the frequency drift value of the reference oscillator 17 by substituting the coefficients $(a_0, \ldots, a_9)$ of the approximated polynomial and the current frequency of TCO 16 for Equation (1), mentioned above. The positioning signal from the GPS satellite is searched at step S25 based on the frequency drift value predicted in this way.

In FIG. 5, the processing at S24 corresponds to drift value predicting means.

Meanwhile, according to the quartz oscillator SPXO or TCXO constituting the reference oscillator 17, normally, the characteristic of the temperature and the frequency tends to change by an aging change or the like and therefore, it is necessary to compensate for a change in the temperature frequency characteristic curve by updating the previously determined coefficients of the approximated polynomial of the temperature frequency characteristic. In correcting the change in the temperature frequency characteristic curve, updating of the coefficients cannot be dealt with only by an offset value (0 degree coefficient of polynomial) in order to restrain the accuracy of predicting the frequency drift value to within ±0.1 ppm, but higher degrees of coefficients need to be updated.

Figure 6:
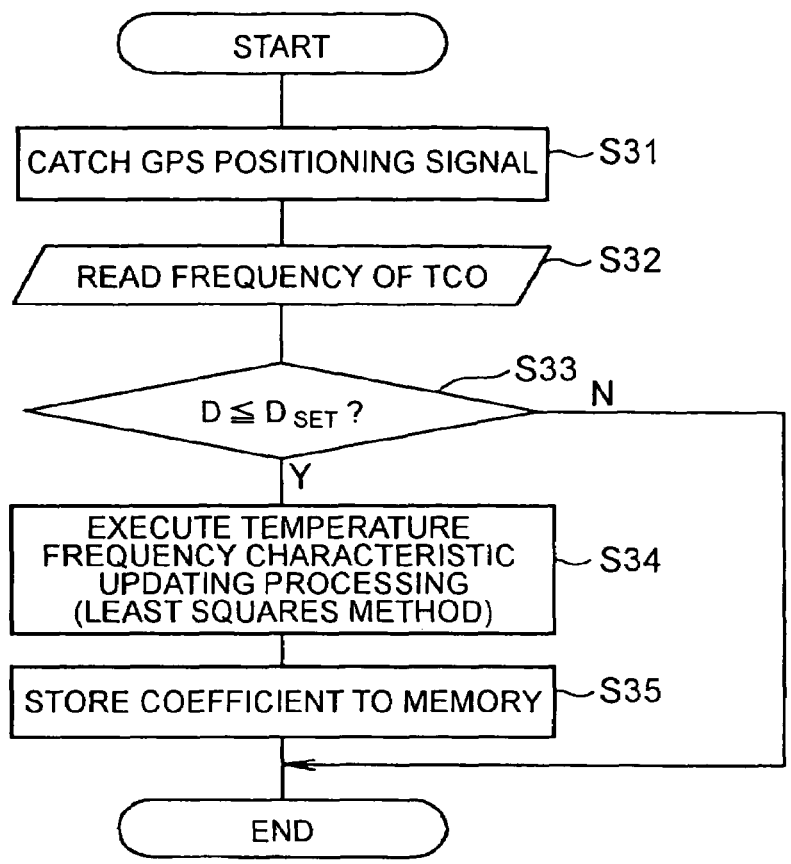
FIG. 6 is a flowchart showing a processing of updating the temperature frequency characteristic of the temperature compensating controller 15 of FIG. 1 according to the first embodiment.

FIG. 6 is a flowchart showing a procedure of a processing of updating the temperature frequency characteristic executed by the temperature compensating controller 15. According to the temperature frequency characteristic updating processing, all of the coefficients of the polynomial representing the temperature frequency characteristic are updated while using the GPS receiver.

First, GPS positioning is started by setting the power source switch of the GPS receiver 1 to the ON state at step S31, and the measured drift value provided by catching the GPS positioning signal by the frequency searching processing of FIG. 5 is read. Successively, the operation proceeds to step S32 to measure the frequency of TCO 16 in GPS positioning and proceeds to step S33.

At step S33, it is determined whether the drift value is adopted in accordance with reliability of the measured drift value provided by GPS positioning. The reliability of positioning is determined by a DOP value (Dilution of Precision: numerical value constituting an index of the accuracy of GPS poisoning) or the like. When the DOP value D is larger than a predetermined value $D_{SET}$ (for example, about 5.0), it is determined that the accuracy of GPS poisoning is poor and the temperature frequency characteristic updating processing is finished without executing the updating. Meanwhile, when $D \leq D_{SET}$, it is determined that accuracy of GPS positioning is excellent, the operation proceeds to step S34 to calculate the coefficients of the temperature frequency characteristic curve. Thereby, the reliability of the updated corrected date can be maintained.

Figure 7:
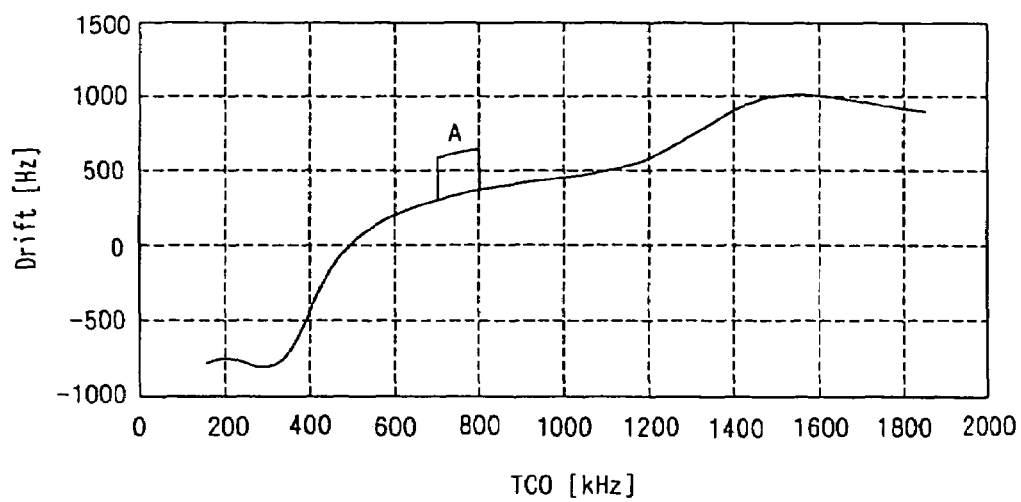
FIG. 7 is an explanatory view of a change in the temperature frequency characteristic of the frequency of TCO and the drift value of the reference oscillator.

Now, assume that the frequency of TCO 16 is changed from 200 kHz to 1800 kHz at an interval of temperatures between −25° C. through 60° C., and the frequency drift value in the range is previously represented by a 9 degree polynomial curve shown in FIG. 7. Assume that when GPS positioning is executed between 700 kHz to 800 kHz in correspondence with temperatures of 33° C. through 37° C., the actual drift value is shifted to a plus side as shown by portion A from an initially calculated polynomial curve.

In this case, as the drift value between 700 kHz through 800 kHz in correspondence with temperatures in GPS positioning, a measured drift value provided by GPS positioning is used, in the other temperature range (200 kHz through 699 kHz and 801 kHz through 1800 kHz), frequencies are selected at pertinent intervals (for example, 1 kHz) and the drift value is calculated for the selected frequency by correspondence with the initial polynomial curve. New coefficients of the polynomial curve are provided by applying the least squares method to sets of data of the frequencies and the drift values.

Figure 8:
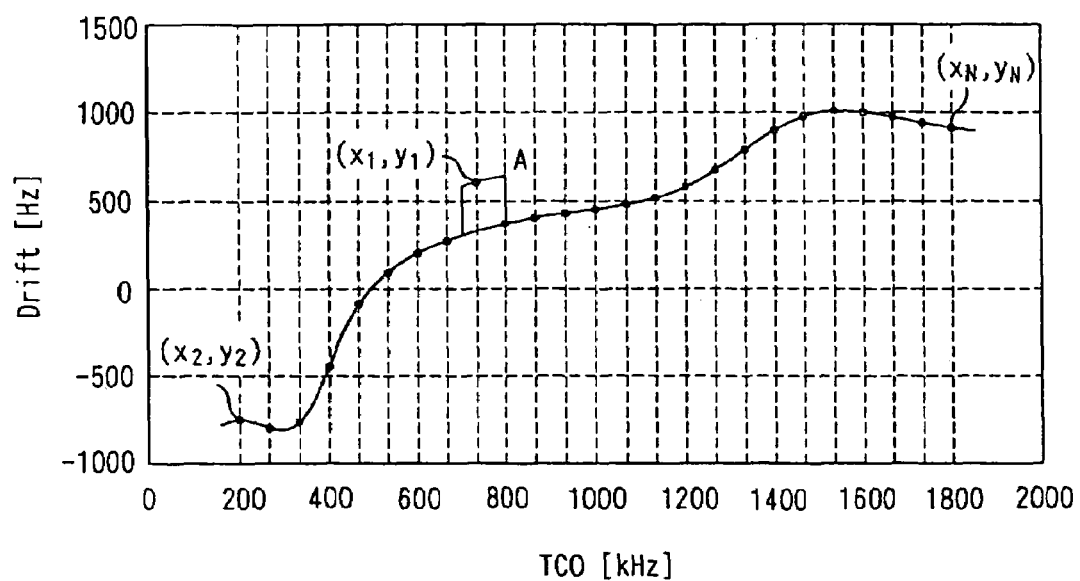
FIG. 8 is an explanatory view of updating a coefficient of the approximated polynomial according to an embodiment of the invention.

Specifically, GPS positioning is executed between 700 kHz through 800 kHz, as shown by FIG. 8, when the actual drift value is shifted to a plus side as in the portion A from the initially calculated 9 degree polynomial curve, sets $(x_1, y_1)$ of measured data of the frequency of TCO 16 in GPS positioning and the measured drift value provided by GPS positioning, and outside of a temperature range of GPS positioning are divided at constant intervals, and by using sets of (N−1) divided data $(x_2, y_2), \ldots, (x_N, y_N)$ successively calculating the corresponding drift values of the divided frequencies $x_2, \ldots, x_N$ from the polynomial curve, $a_0(N)$ through $a_9(N)$ are calculated based on Equation (3), mentioned above, to calculate all the coefficients of the new polynomial curve.

Further, at step S35, the coefficients of the temperature frequency characteristic curve are updated by storing the successively calculated coefficients to the memory 13.

In FIG. 6, the processing at step S34 corresponds to characteristic updating means.

In this way, by dividing outside of the temperature range of GPS positioning at constant intervals and applying the least squares method by using the successively calculated divided data, the memory capacity can considerably be saved in comparison with the case of applying the least squares method without using the divided data. That is, since the divided data is successively calculated based on the coefficients of the polynomial curve stored to the memory 13, it is not necessary to store all the data of the frequencies of 200 kHz through 1800 kHz in correspondence with the temperature range of −25° C. through 60° C. which can be used by the GPS receiver to the memory 13.

Further, in order to store all the data to the memory 13, the frequencies of TCO 16 and the frequency drift values of the reference oscillator 17 need to be measured by putting the GPS receiver 1 again to the thermostat and changing the temperature and therefore, it is difficult to update the coefficients of the polynomial curve while using the GPS receiver 1, however, by using the divided data, the coefficients of the polynomial curve can be updated while using the GPS receiver 1.

Figure 9A:
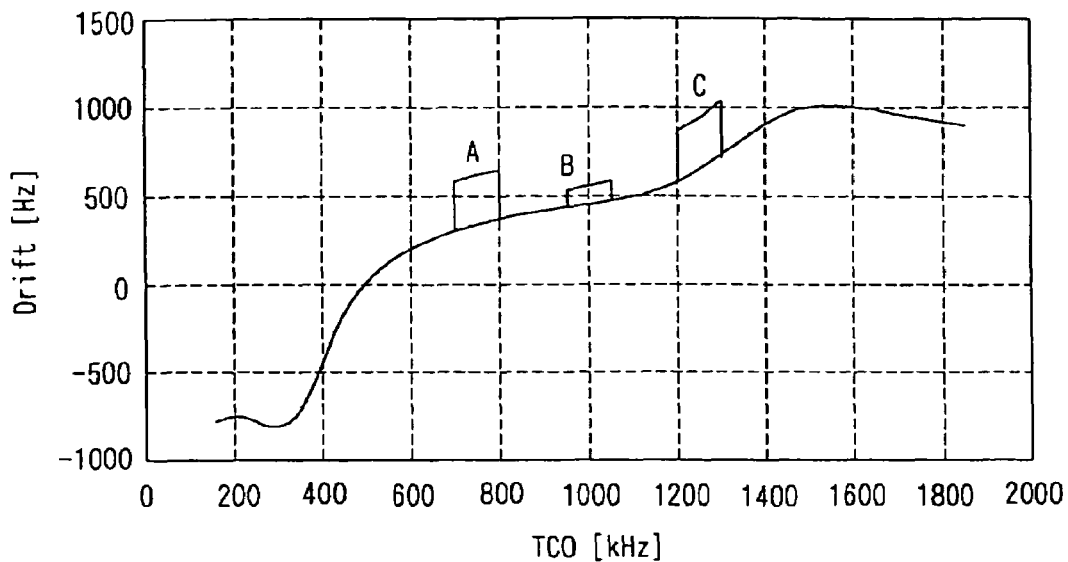
FIG. 9 is an explanatory view of updating the coefficient of the approximated polynomial in a different temperature range according to an embodiment of the invention.
Figure 9B:
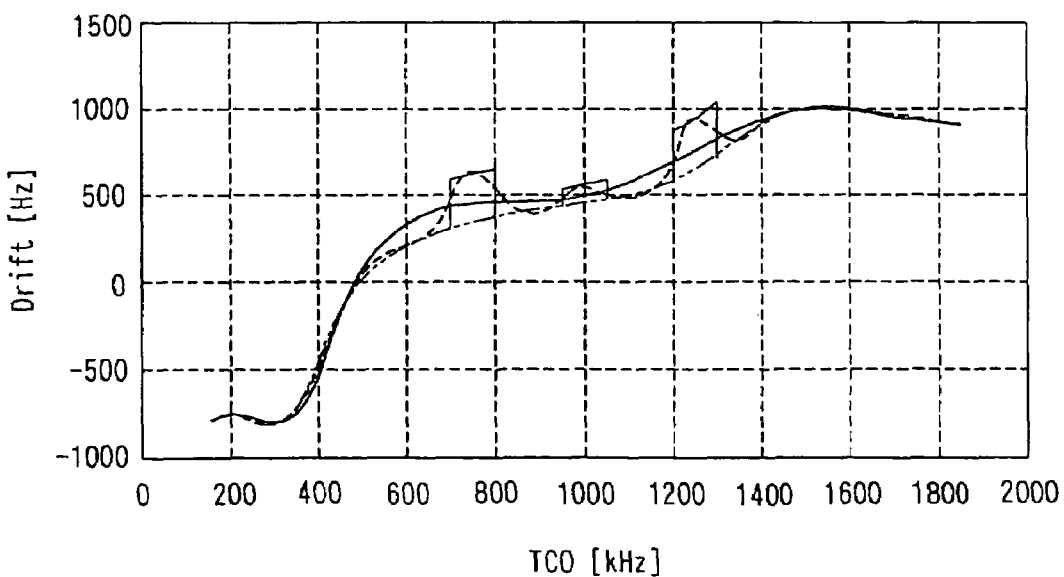

A bold line of FIG. 9(b) indicates a polynomial curve after updating when coefficients of the polynomial curve are updated by executing GPS positioning in three temperature ranges of A, B, C of FIG. 9(a). In this way, by executing GPS positioning at different temperature ranges, an actual polynomial curve can be approximated in a wide temperature range. Further, as shown by a broken line of FIG. 9(b), the higher the degree of the polynomial (for example, 30 degree), the smaller the residual from the actual polynomial curve can be made.

Next, a second embodiment of the invention will be explained.

According to the second embodiment, a processing of determining and updating coefficients of an approximated polynomial representing a temperature frequency characteristic of the frequency of TCO 16 and the frequency drift value of the reference oscillator 17 is executed by applying a successive least squares method in place of the least squares method.

Figure 10:
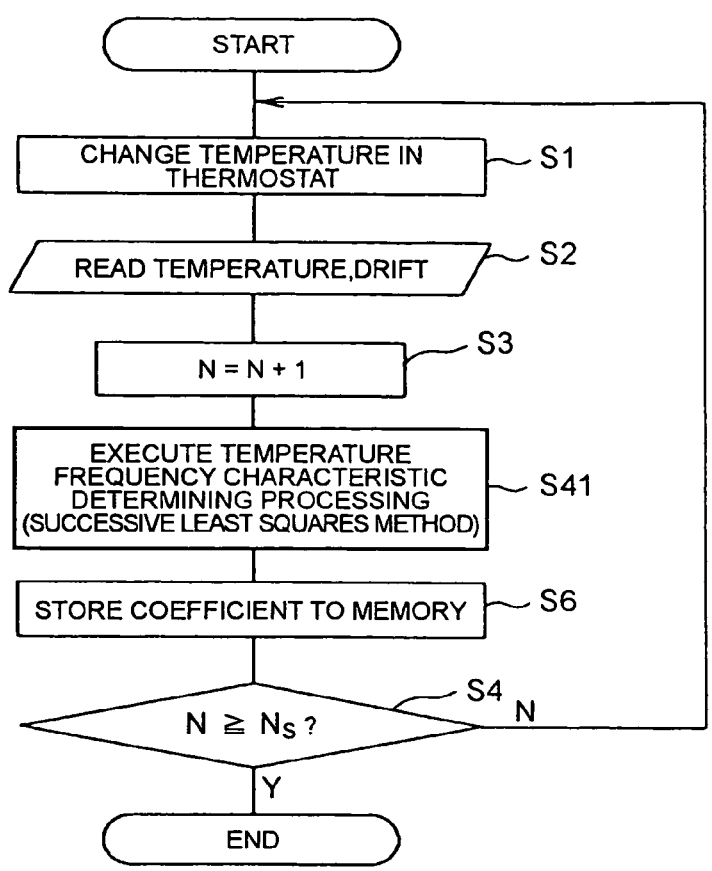
FIG. 10 is a flowchart showing a processing of determining a temperature frequency characteristic of the temperature compensating controller 15 of FIG. 1 according to a second embodiment.

FIG. 10 is a flowchart of a procedure of determining a temperature frequency characteristic executed by the temperature compensating controller 15, in the temperature frequency characteristic determining processing according to the first embodiment shown in FIG. 2, there are carried out processings similar to those of FIG. 2 except that the processing at step S4 is shifted to after the processing at step S6, and step S41 for determining the coefficients of the approximated polynomial of the temperature frequency characteristic by the successive least squares method is made to substitute for the processing of step S5, and portions the same as those of FIG. 2 are attached with the same notations and a detailed explanation thereof will be omitted.

The GPS receiver 1 is put into the thermostat capable of receiving the GPS signal, the frequency of TCO 16 and the frequency drift value of the reference (oscillator 17 are measured while changing the temperature in the thermostat, and the data acquiring number count value N for measuring the acquired number of data is incremented, thereafter, the operation proceeds from step S3 to S41 and the coefficients of the temperature frequency characteristic curve are calculated by applying the successive least squares method.

Now, by designating notations $f_N^k$ and $g_N^k$ by Equation (4), mentioned below, notations F(N), A(N), G(N) are put as shown by Equations (5) through (7), shown below.

$$f_N^k = \sum_{i=1}^{N} x_i^k \quad (k = 0, \cdots, 9) \tag{4}$$

$$g_N^k = \sum_{i=1}^{N} y_i \times x_i^k \quad (k = 0, \cdots, 9)$$

$$F(N) = \begin{bmatrix} f_N^0 & f_N^1 & \cdots & \cdots & f_N^9 \\ f_N^1 & f_N^2 & \cdots & \cdots & f_N^{10} \\ \cdots & \cdots & \cdots & \cdots & \cdots \\ \cdots & \cdots & \cdots & \cdots & \cdots \\ f_N^9 & f_N^{10} & \cdots & \cdots & f_N^{18} \end{bmatrix} \quad (5)$$

$$A(N) = \begin{bmatrix} a_0(N) \\ a_1(N) \\ \cdots \\ \cdots \\ a_9(N) \end{bmatrix} \quad (6)$$

$$G(N) = \begin{bmatrix} g_N^0 \\ g_N^1 \\ \cdots \\ \cdots \\ g_N^9 \end{bmatrix} \quad (7)$$

When Equations (3) and Equations (5) through (7), mentioned above, are rearranged, the equations can be represented as shown by Equation (8), mentioned below.

$$A(N)=F^{-1}(N)F(N-1)A(F-1)+y_N F^{-1}(N)X(N) \quad (8)$$

where $X(N)=[x_N^0 \ x_N^1 \ \ldots \ x_N^9]^T$

That is, the equation signifies that a predicted coefficient at N-th time point is established from a predicted coefficient at (N−1)-th time point one time before and modification based on N-th data, and coefficients of an approximated polynomial can be calculated successively by Equation (8), mentioned above. At this occasion, it is necessary to previously give initial values F(0) and A(0).

Next, the operation proceeds to step S6 to previously record 10 coefficients $a_0(N)$ though $a_9(N)$ represented by 62 bits of the 9 degree polynomial to the memory 13, and proceeds to step S4 to determine whether the count value N is equal to or larger than the data acquiring number set value Ns. The data acquiring number set value $N_s$ is set to a data number capable of determining a further accurate temperature frequency characteristic (for example, about 5000).

When a result of determination at step S4 is $N<N_s$, it is determined that the data number for determining the further accurate temperature frequency characteristic is not reached and the operation proceeds to step S1, when $N \geq N_s$, the temperature frequency characteristic determining processing is finished.

In FIG. 10, the processing at step S41 corresponds to characteristic updating means.

In this way, the 9 degree approximated polynomial calculated by the successive least squares method becomes as shown by a broken line of FIG. 3 and the residual from the measured value can be restrained within ±0.05 ppm.

In this way, by executing the temperature frequency characteristic determining processing applied with the successive least squares method shown in FIG. 10, the memory can be saved in comparison with the case of applying the least squares method as shown by FIG. 2. That is, when the approximated polynomial is calculated by the least squares method, all the sets of N data of $(x_i, y_i)$ are temporarily stored to the memory, thereafter, the simultaneous equations of Equation (3) are solved and therefore, in the case of N=5000, a memory of 5000 sets is needed. On the other hand, in the case of applying the successive least squares method, when the degree of the polynomial is 9 (m=9), only a memory of 3×(m+1)=30 is needed and therefore, a large amount of memory temporarily needed can be saved.

Figure 11:
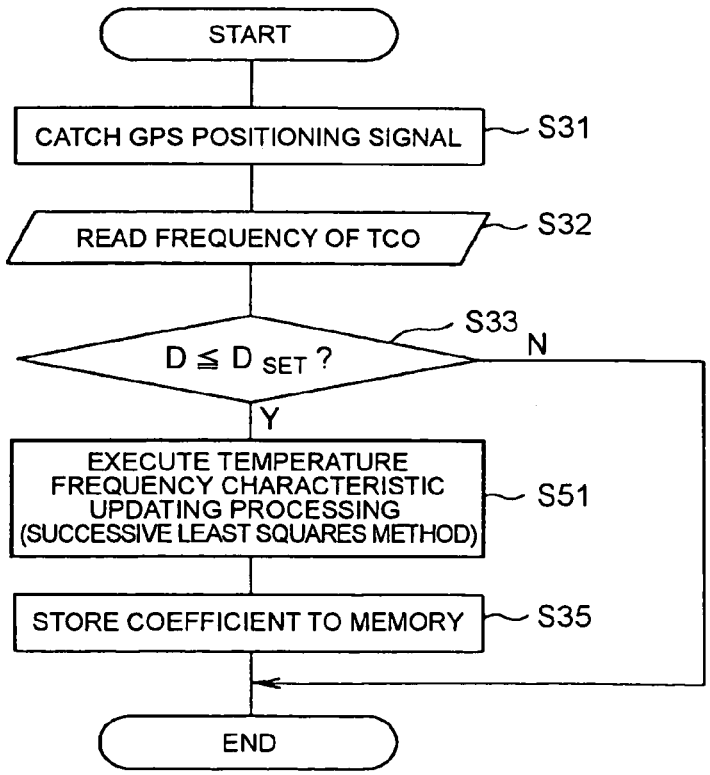
FIG. 11 is a flowchart showing a processing of updating the temperature frequency characteristic of the temperature compensating controller 15 of FIG. 1 according to the second embodiment.

FIG. 11 is a flowchart of a procedure of processing to update the temperature frequency characteristic executed at the temperature compensating controller 15, there are executed processings similar to those of FIG. 6 in which in the temperature frequency characteristic updating processing according to the first embodiment shown in FIG. 6, step S51 of updating coefficients of an approximated polynomial of a temperature frequency characteristic by the successive least squares method is made to substitute for the processing at S34, portions the same as those of FIG. 6 are attached with the same notations and a detailed explanation thereof will be omitted.

After catching the GPS positioning signal and reading the frequency of TCO 16 in GPS positioning, when it is determined to update the coefficients of the approximated polynomial of the temperature frequency characteristic by adopting the frequency drift value provided by GPS positioning at step S33, the operation proceeds to step S51 to update all the coefficients of the approximated polynomial by the successive least squares method.

Now, assume that temperatures fall in a range of −25° C. through 60° C., the value of TCO 16 is changed from 200 kHz to 1800 kHz, the frequency drift value in the range is previously represented by the 9 degree polynomial curve as shown by FIG. 7. Further, assume that when GPS positioning is executed between 700 kHz and 800 kHz in correspondence with temperatures of 33° C. through 37° C., the actual drift value is shifted to the plus side as shown by the portion A in comparison with an initially calculated polynomial curve.

In this case, as shown by FIG. 8, by dividing sets $(x_1, y_1)$ of measured data of the frequencies of TCO 16 and measured drift values provided by GPS positioning in GPS positioning and outside of the temperature range of GPS positioning are divided at constant intervals and using sets $(x_2, y_2), \ldots, (x_N, y_N)$ of (N−1) divided data obtained by successively calculating corresponding drift values from the divided frequencies $x_2, \ldots, x_N$ from the polynomial curve, A(N) is calculated based on Equation (8), mentioned above, by the successive least squares method and all the coefficients of a new polynomial curve are calculated.

In FIG. 11, the processing at step S51 corresponds to characteristic updating means.

In this way, by dividing outside of the temperature range of GPS positioning at constant intervals and applying the successive least squares method by using the successively calculated divided data, all the coefficients of the approximated polynomial can be updated without overflowing the memory in comparison with the case of applying the successive least squares method without using the divided data. Incidentally, when all the coefficients of the approximated polynomial are updated by applying the normal successive least squares method as it is without using the divided data, in initially calculating the polynomial curve, the successive least squares method is applied, respective elements of matrices of Equations (5) and (7) are stored to the memory 13, the respective elements of the matrices of Equations (5) and (7) are successively calculated by using the respective elements of the matrices stored to the memory 13, the measured drift values provided by GPS positioning and the frequencies of TCO 16 in GPS positioning, and the coefficients A(N) of a new polynomial is provided based on Equation (8). However, in this case, when the degree of the polynomial is designated by notation m, a memory of 3×(m+1) is successively added with measured values of the frequency drift values to the power of the frequencies of TCO 16 in correspondence therewith and therefore, there is needed to devise to solve a problem of overflowing and ensure calculation accuracy.

Next, a third embodiment of the invention will be explained.

According to the third embodiment, processings of determining and updating coefficients of an approximated polynomial representing a temperature frequency characteristic of the frequency of TCO 16 and the frequency drift of the reference oscillator 17 is executed by applying Kalman filter in place of the least squares method or the successive least squares method.

Kalman filter is a filter (algorithm) constituting an object by a linear probability system and successively outputting an optimum predicted value of a state $u_k$ (n×1 vector) of the system by inputting observing signals $y_i$ (i=0, ..., k).

A basic model of Kalman filter is represented by Equations (9) and (10) and is referred to as a state space model.

$$u_{k+1} = F_k u_k + w_k \tag{9}$$

$$y_k = H_k u_k + v_k \tag{10}$$

where, Equation (9) is referred to as a state equation, Equation (10) is referred to as an observation equation, notation $u_k$ is referred to as a state of a system at time $t_k$, or a state vector.

In this case, a state $u_{k+1}$ of the system at time $t_{k+1}$ is represented by multiplying a state $u_k$ of the system at time $t_k$ by a state transition matrix $F_k$ and adding a white noise $w_k$ referred to as the system noise. This is based on the fact that generally, a signal having an arbitrary static property can be represented as an output of a linear dynamic system added with the white noise.

Meanwhile, under a normal environment, the state $u_k$ of the system cannot frequently be observed directly and it is general that the state $u_k$ is observed as a linear function thereof. Hence, the output of the system, that is, an observed value $y_k$ is represented by multiplying the state $u_k$ by an observation matrix $H_k$ added with a white noise $v_k$ referred to as observation noise.

Here, in consideration of irregularity of noise, $\{u_k\}$, $\{y_k\}$, $\{w_k\}$, $\{v_k\}$ are dealt with as stochastic processes and generally provided with vector values ($u_k$, $w_k \in R^N$, $y_k$, $v_k \in R^M$).

Further, there are cases in which parameters $F_k$ and $H_k$ are derived from a physical law governing a phenomenon and a case in which the system parameters are derived from a correlation previously measured by an experiment and the system parameters generally-become definite matrices.

In the system model, a problem of calculating a minimum variance predicted value of $U_{k|k} = E\{u_k | y_0, \ldots, y_k\}$ or $U_{k|k-1} = E\{u_k | y_0, \ldots, y_{k-1}\}$ when consecutive observation values of k+1 ($y_0, \ldots, y_k$) are given is referred to as a Kalman filtering problem and an algorithm for providing a solution thereof is referred as Kalman filter.

In order to solve the Kalman filtering problem, with regard to the system noise $\{w_k\}$, the observation noise $\{v_k\}$ and an initial state $u_0$, the following is assumed.

$$E\{v_i \cdot v_j^T\} = \delta_{ij} R_i,$$

$$E\{w_i \cdot w_j^T\} = \delta_{ij} Q_i,$$

$$E\{v_i \cdot w_j^T\} = 0,$$

$$E\{u_0 \cdot w_k^T\} = 0,$$

$$E\{u_0 \cdot v_k^T\} = 0,$$

$$E\{u_0\} = u_{a0},$$

$$E\{[u_0 - u_{a0}][u_0 - u_{a0}]^T\} = p_0 \tag{11}$$

where, notation $\delta_{ij}$ designates Kronecker's delta which is 1 when i=j and 0 otherwise, notation $u_{a0}$ designates known mean vector, notations $R_k$, $Q_k$ and $p_0$ designate known covariance matrices, and $u_0$, $\{w_k\}$ and $\{v_k\}$ are respectively Gaussian.

A result of solving the Kalman filtering problem based on assumption of Equation (11) is as follows.

$$U_{k|k} = u_{k|k-1} + K_k(y_k - H_k U_{k|k-1}) \tag{12}$$

$$U_{k+1|k} = F_k U_{k|k} \tag{13}$$

$$K_k = p_{k|k-1} H_k^T (H_k P_{k|k-1} H_k^T + R_k)^{-1} \tag{14}$$

$$P_{k|k} = P_{k|k-1} - K_k H_k P_{k|k-1} \tag{15}$$

$$P_{k+1|k} = F_k P_{k|k} F_k^T + Q_k \tag{16}$$

$$U_{0|-1} = u_{a0}, P_{0|-1} = p_0 \tag{17}$$

where notation $K_k$ designates a filter gain.

The state $u_k$ of the system can be predicted by observing the signal $y_k$ while updating time k by using Equations (12) through (17).

Figure 12:
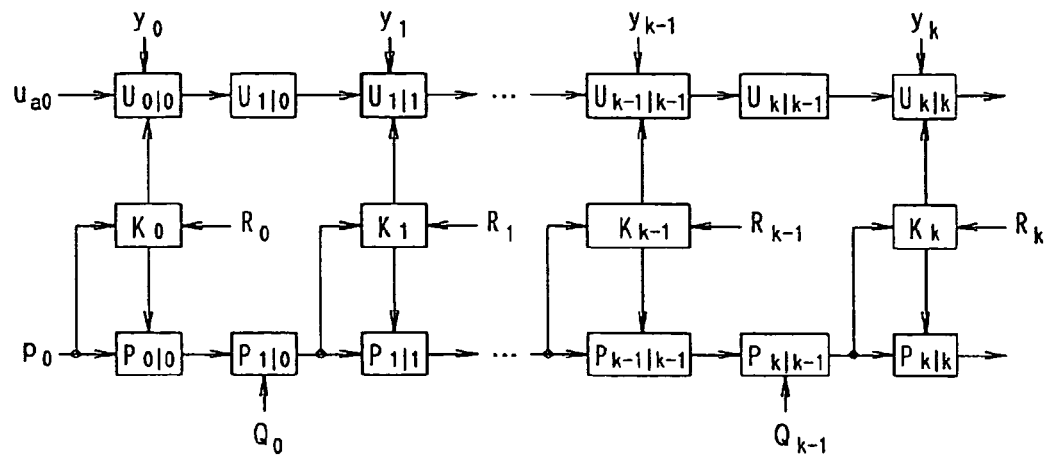
FIG. 12 is an explanatory view of a procedure of calculating Kalman filter.

A procedure of calculating the Kalman filter is as shown by FIG. 12, first, $K_0$ can be calculated from $p_0$ and $R_0$, $P_{0|0}$ can be calculated from $p_0$ and $K_0$, and $U_{0|0}$ can be calculated from $u_{a|0}$ and $K_0$ and $y_0$. Next, $P_{1|0}$ can be calculated from $P_{0|0}$ and $Q_0$, $U_{1|0}$ can be calculated from $U_{0|0}$, further, $K_1$ can be calculated from $P_{1|0}$ and $R_1$, $P_{1|1}$ can be calculated from $P_{1|0}$ and $K_1$, and $U_{1|1}$ can be calculated from $U_{1|0}$ and $K_1$ and $y_1$.

That is, when the mean vector $u_{a0}$ and the covariance matrices $R_0, \ldots, R_k, Q_0, \ldots, Q_k, P_0$ and the observing values $y_0, \ldots, y_k$ are given, the optimum predicted values $U_{0|0}, \ldots, U_{k|k}$ minimizing the mean square error and the covariance matrices $P_{0|0}, \ldots, P_{k|k}$ of the predicted error can successively be calculated. In other words, the Kalman filter successively calculates the mean vector having the condition of $u_k$ and the covariance matrices, particularly, in the case of Gaussian, the calculation signifies calculation of a probability density function with the condition of $u_k$ changed from time to time.

Next, an explanation will be given of a method of calculating the coefficients $a = (a^0(k), \ldots, a_{12}(k))$ of the approximated polynomial $y = f(a, x_k)$ representing the temperature frequency characteristic of the frequency of TCO 16 and the frequency drift of the reference oscillator 17.

In this case, the state $u_k$ of the system becomes the coefficient a of the polynomial, and the state equation of Equation (9) is represented as follows by constituting a unit matrix by the state transition matrix $F_k$.

$$u_{k+1} = u_k + w_k \tag{18}$$

where $u_k = [a_0(k), \ldots, a_m(k)]^T$.

Further, the observation equation of Equation (10) is represented as follows.

$$y_k = H_k u_k + v_k \tag{19}$$

where the observation matrix $H_k$ is represented by the frequency of TCO 16 and $H_k = [x(k)^0, \ldots, x(k)^m]$.

In initial setting, from measured values of TCO and the quartz oscillator drift constituted by means of a number of samples, a mean 12 degree prepolynomial is calculated by Kalman filter, the least squares method or the successive least squares method and a coefficient thereof is set to $u_{a0}$.

Next, it is set that $R = \sigma_v^2$ (however, $\sigma_v \neq 0$), $Q = (\sigma_w^2/\sigma_v^2) I$ (I designates unit vector), and when $P_{k|k-1}/\sigma_v^2 = P_{k|k-1}$ is put, since $\sigma_v^2 = R = 1$, Equation (14) becomes as follows.

$$K_k = P_{k|k-1} H_k^T (H_k P_{k|k-1} Hk^T + 1)^{-1} \quad (20)$$

where $\sigma_w^2$ designates a variance of $\{w_k\}$ and $\sigma_v^2$ designates a variance of $\{v_k\}$.

Further, since Fk is the unit matrix, Equation (16) is as follows.

$$P_{k+1|k} = P_{k|k} + (\sigma_w^2/\sigma_v^2) I \quad (21)$$

Finally, by pertinently setting $\epsilon_0$ as $P_{0|-1} = \epsilon_0 I$, and pertinently setting $\sigma_w^2/\sigma_v^2$, Kalman filter algorithm can be executed.

Figure 13:
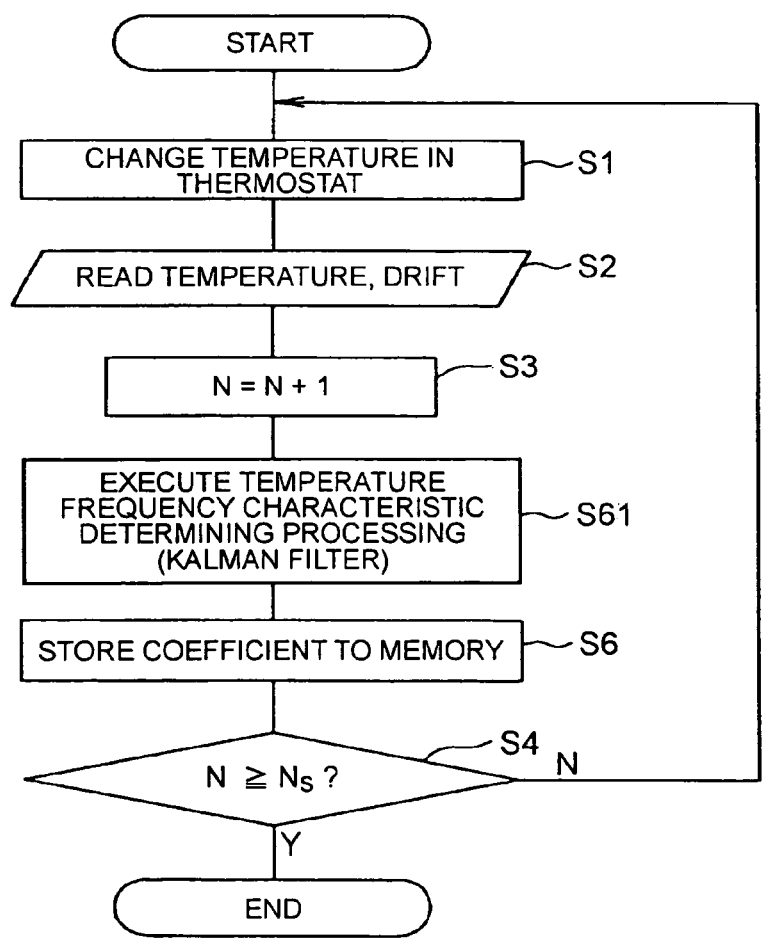
FIG. 13 is a flowchart showing a processing of determining a temperature frequency characteristic of the temperature compensating controller 15 of FIG. 1 according to a third embodiment.

FIG. 13 is a flowchart of a procedure of a processing of determining a temperature frequency characteristic executed by the temperature compensating controller 15, in the temperature frequency characteristic determining processing according to the second embodiment shown in FIG. 10, processings similar to those of FIG. 10 are executed except that a step S61 of determining the coefficients of the approximated polynomial of the temperature frequency characteristic by the Kalman filter is made to substitute for the processing at step S41, portions the same as those of FIG. 10 are attached with the same notations and a detailed explanation thereof will be omitted.

First, the GPS receiver 1 for testing is put into the thermostat capable of receiving the GPS signal, the frequency of TCO 16 and the frequency drift value of the reference oscillator 17 are measured while changing the temperature in the thermostat, the data acquiring number count value N for measuring the acquired number of data is incremented, thereafter, the operation proceeds from step S3 to step S61, and the coefficients of the temperature frequency characteristic curve is calculated by applying the Kalman filter.

In FIG. 13, the processing at step S61 corresponds to characteristic determining means.

Figure 14A:
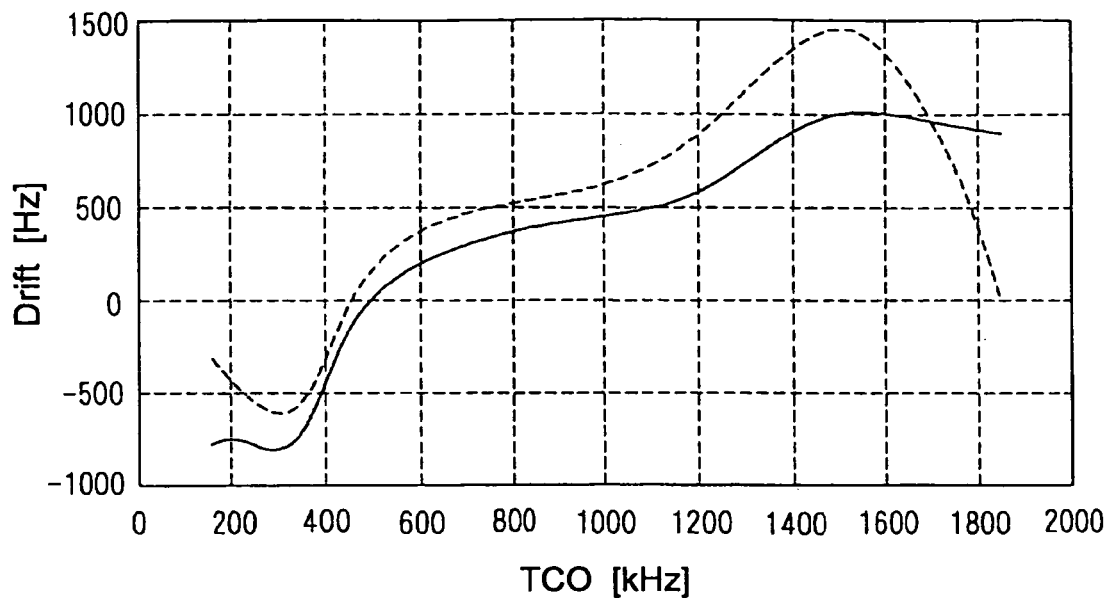
FIG. 14(a) is a diagram showing a precharacteristic curve and an actual characteristic curve.

A 12 degree approximated polynomial calculated by the Kalman filter in this way is as shown by a bold line of FIG. 14(a), and the residual from the measured value can be restrained within ±0.1 ppm.

In this way, by executing the temperature frequency characteristic determining processing applied with the Kalman filter shown in FIG. 13, similarly to the case of applying the successive least squares method shown in FIG. 10, the memory can be saved in comparison with the case of applying the least squares method as shown by FIG. 2.

Figure 15:
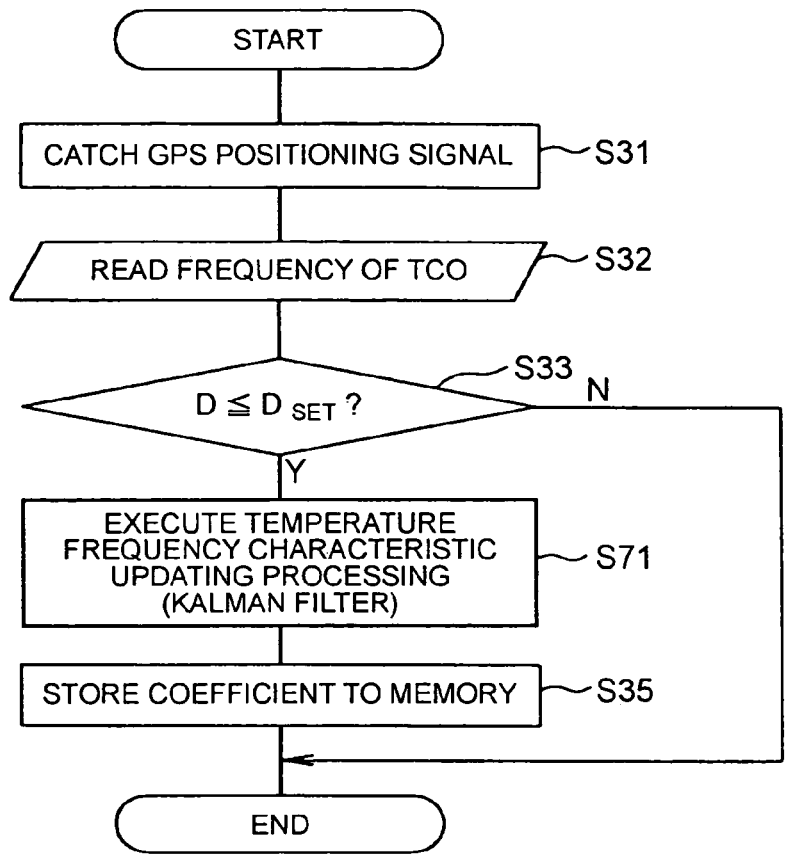
FIG. 15 is a flowchart showing a processing of updating a temperature frequency characteristic of the temperature compensating controller 15 of FIG. 1 according to the third embodiment.

FIG. 15 is a flowchart of a procedure of processing to update a temperature frequency characteristic executed at the temperature compensating controller 15 according to the third embodiment, processings similar to those of FIG. 11 are executed except that in the temperature frequency characteristic updating processing according to the second embodiment shown in FIG. 11 a step S71 for updating a coefficient of an approximated polynomial of a temperate frequency characteristic by the Kalman filter is made to substitute for the processing at step S51, portions the same as those of FIG. 11 are attached with the same notations and a detailed explanation thereof will be omitted.

When the GPS positioning signal is caught, the frequency of TCO 16 in GPS positioning is read, thereafter, it is determined at step S33 that the coefficient of the approximated polynomial of the temperature frequency characteristic is updated by adopting the frequency drift value provided by GPS positioning, the operation proceeds to step S71 to update all the coefficients of the approximated polynomial by the Kalman filter.

In FIG. 15, the processing at step S71 corresponds to characteristic updating means.

Now, assume that in a temperature range of −25° C. through 60° C., the value of TCO 16 is changed from 200 kHz to 1800 kHz and the frequency drift value in the range is previously represented by the 12 degree polynomial curve shown in the bold line of FIG. 14(a). Assume that an inherent characteristic curve is as shown by a broken line of FIG. 14(a) and GPS positioning is executed between the temperature range of 20° C. through 40° C.

In this case, similar to FIG. 8, all the coefficients of a new polynomial curve are calculated by calculating the minimum variance predicted value $U_{k|k}$ of the state of $U_k$ of the system by the Kalman filter by dividing sets of the measured data of the frequencies of TCO 16 in GPS positioning and the measured drift values provided by GPS positioning and outside of the temperature range of GPS positioning at constant intervals and using sets of divided data obtained by successively calculating the corresponding drift values from the divided frequency values from the polynomial curve.

Figure 14B:
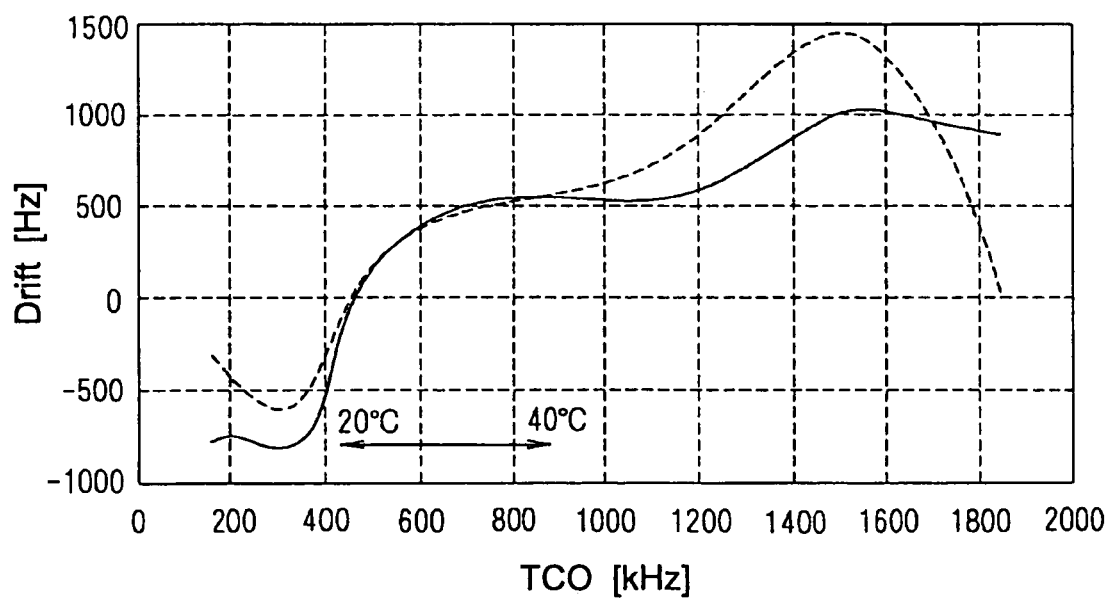
FIG. 14(b) is a diagram showing the precharacteristic curve after having been corrected and the actual characteristic curve.

The new polynomial curve calculated in this way is as shown by a bold line of FIG. 14(b), in the range of measuring the frequency of TCO 16 and the drift value provided by GPS positioning, the polynomial curve is approximated to the inherent characteristic curve shown by a broken line with considerable accuracy.

In this case, since there is provided only data of the frequencies of TCO 16 and the measured drift values in a limited temperature range of 20° C. through 40° C., even when the 12 degree polynomial is used, the error of approximation is not confined within ±0.05 ppm, however, the error of approximation can be confined within ±0.1 ppm and therefore, the data is effective in updating the coefficients of the polynomial curve.

By using such a method, the average coefficients of the approximated polynomial previously calculated and stored to the memory can be updated to be approximated to the inherent characteristic curve while actually using the quartz oscillator.

According to the above-described respective embodiments, data stored to the memory 13 is only the coefficients of the temperature frequency characteristic curve of the oscillator and therefore, in comparison with the case of applying either one of the normal least squares method and the normal successive least squares method as it is, the memory can considerably be saved and the temperatures outside of the detecting range in GPS positioning are divided at constant intervals, the frequency drift values in corresponding with the divided temperatures are calculated successively based on the coefficients of the polynomial curve before updating stored to the memory 13, the coefficients of the polynomial curve are updated by using the sets of data provided in this way and therefore, even when the successive least squares method is applied, the problem of overflowing is not posed.

Further, with regard to temperatures outside of the detecting range in GPS positioning, the frequency drift values are calculated from the coefficients of the polynomial curve before updating, the coefficients of the polynomial curve are updated by using the calculated values and therefore, in comparison with the case of updating the coefficients by using only data within the range of measured temperatures, a deterioration of prediction accuracy at outside of the measured temperature range can be restrained.

Further, the temperature frequency characteristic of the reference oscillator 17 is approximated by 9 degree or 12 degree polynomial, all the coefficients of the approximated polynomial are updated from the measure drift value of the oscillating frequency and the temperatures at a timing of the detection and therefore, a change in the temperature frequency characteristic by an aging change or the like can further accurately be followed, and prediction accuracy of the frequency drift value can be restrained within ±0.1 ppm.

Further, the GPS receiver for testing is previously put into the thermostat, the approximated polynomial representing the temperature frequency characteristic of the reference oscillator 17 is calculated, the coefficients are stored to the memory 13, the coefficients are updated for each GPS positioning to be gradually approximated to those of the actual characteristic curve and therefore, it is not necessary to calculate the coefficients of the temperature frequency characteristic curve for respective products by putting the GPS receivers into the thermostat one by one and cost in fabricating the GPS receiver can be reduced.

Now, although in the above-described respective embodiments, an explanation has been given of the case of approximating the polynomial representing the temperature frequency characteristic of the frequency of TCO 16 and the drift value of the reference oscillator 17 by 9 degree or 12 degree, the invention is not limited thereto. Although the higher the degree of the polynomial (for example, about 30 degree), the higher the accuracy of updating the coefficients of the temperature frequency characteristic, the degree may be equal to or larger than 5 by which the residual is restrained within ±0.1 ppm. In this case, the temperature frequency characteristic curve is represented by the following equation.

$$f(a, x) = a_0 + a_1 \times a_2 x^2 + \ldots + a_m x^n \quad (9)$$

where notation m designates a degree of a polynomial.

Further, although in the above-described respective embodiments, in the temperature frequency characteristic updating processings of FIG. 6, FIG. 11, FIG. 15, an explanation has been given of the method of determining reliability of GPS positioning by the DOP value at step S33, the invention is not limited thereto but the coefficients may be updated by adopting the frequency drift values when the frequency drift value provided by GPS positioning is equal to or larger than a standard variation of the residual of the value of the approximated polynomial.

Further, although according to the above-described respective embodiments, an explanation has been given of the case of predicting the frequency drift value of the reference oscillator 17 by using the coefficients of the approximated polynomial representing the temperature frequency characteristic stored to the memory 13 and the frequency measured by the TCO 16, the invention is not limited thereto but when there is an allowance in the memory capacity, sets of data of the measured drift values provided by GPS poisoning and the frequencies of TCO 16 in positioning maybe stored to the memory, in the range of the detected temperatures of GPS positioning, the measured drift values stored to the memory may be adopted as predicted drift values.

Furthermore, although according to the above-described respective embodiments, an explanation has been given of the case of measuring the drift value by positioning by the GPS receiver, the invention is not limited thereto but when the GPS receiver is integrated to, for example, a portable telephone, the drift value of the oscillating frequency may be measured by utilizing a carrier frequency of a base station of the portable telephone, the temperature frequency characteristic of the oscillator may be corrected and the offset frequency drift value may be predicted.

Next, a fourth embodiment of the invention will be explained.

According to the fourth embodiment, the invention compensates for a temperature of a gyro sensor in a small-sized information terminal having a GPS function utilizing the gyro sensor for correcting shaking of the hand at a digital camera portion thereof.

Figure 16:
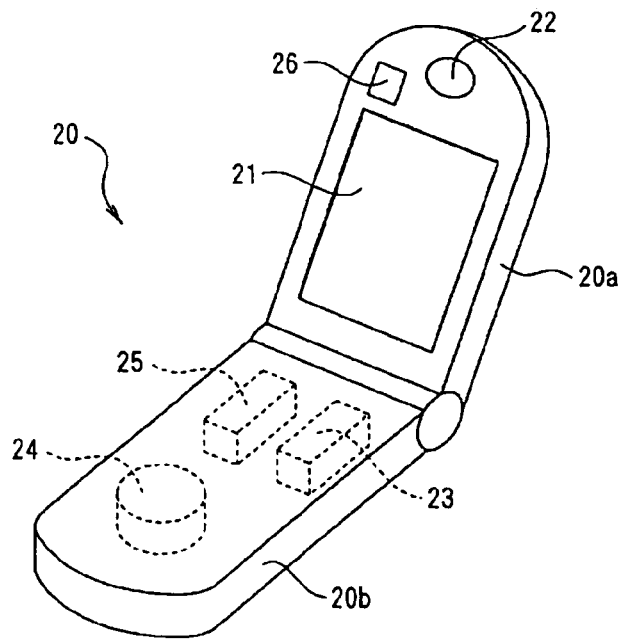
FIG. 16 is an outline constitution view showing a fourth embodiment.

FIG. 16 is an outline constitution view according to the fourth embodiment when the invention is applied to a portable terminal of a code division multiple access (CDMA) type mounted with a GPS function (hereinafter, referred to as CDMA terminal) which is a kind of a portable telephone, extracting only a characteristic outline constitution in a state of opening a CDMA terminal 20 of a folding type held by a user.

The CDMA terminal 20 is constituted by a body upper portion 20a and a body lower portion 20b. An inner face of the body upper portion 20a is provided with a display portion 21 comprising a TFT color liquid crystal panel having a backlight and an upper end portion of the body upper portion 20a is provided with a camera portion 22.

Further, the body lower portion 20b includes a GPS unit 23, a magnetism sensor 24 for acquiring information of a photographing orientation (pan angle) in which the camera portion 22 is directed by detecting the geomagnetism, a gyro sensor 25 for acquiring information of a photographing angle (tilt angle) in a height direction in which the camera portion 22 is directed, and a gyro sensor 26 for providing information of blurring the camera portion in photographing other than a key input portion and the like, not illustrated.

Further, photographing by the camera portion 22 is carried out by opening the folding type CDMA terminal 20 owned by the user as shown by FIG. 16 and in a state in which the body upper portion 20a is substantially orthogonal to a direction of a line of sight of the user.

Figure 17:
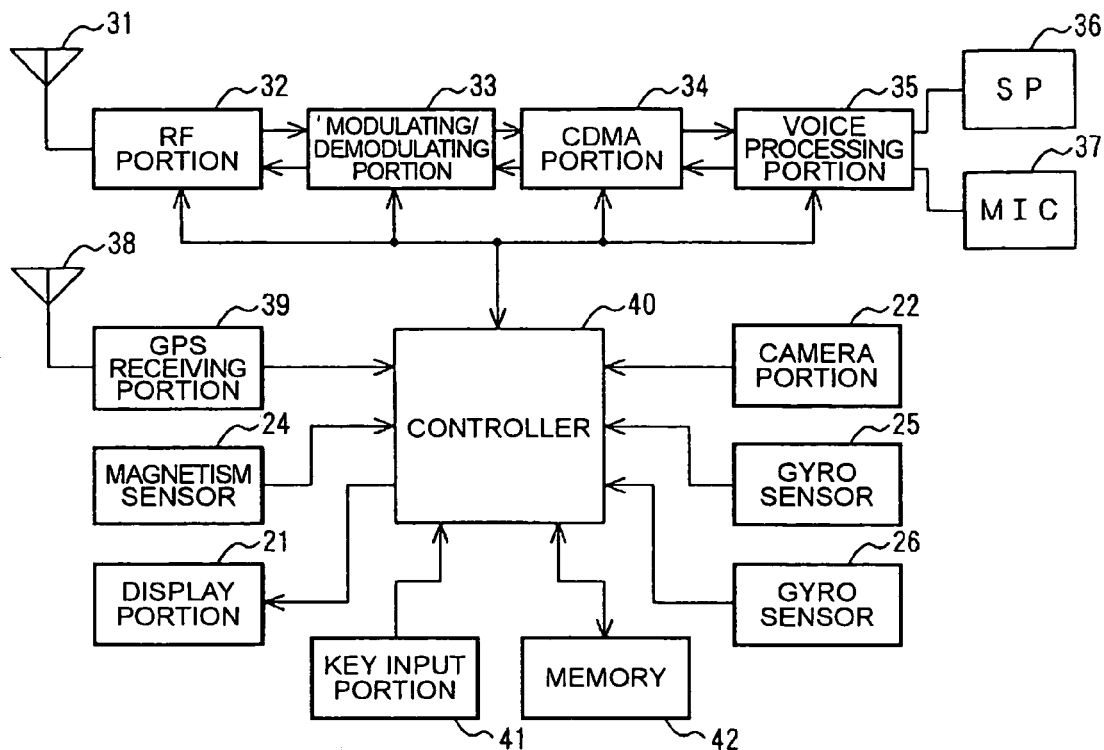
FIG. 17 is a diagram showing a circuit constitution of a CDMA terminal of FIG. 16.
Figure 18:
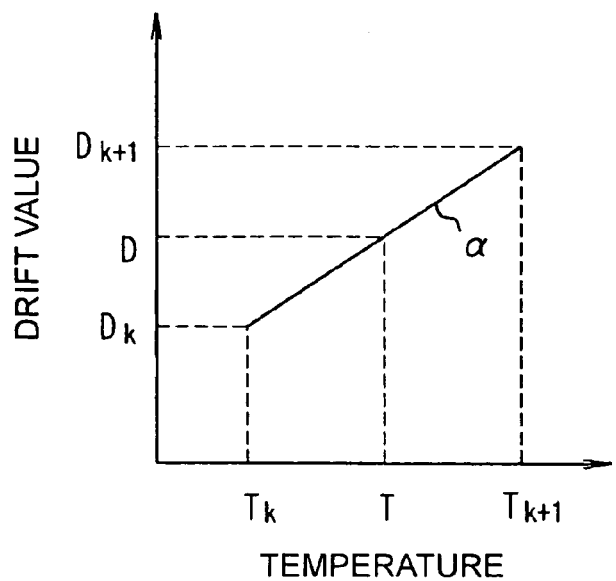
FIG. 18 is a characteristic diagram showing a relationship between a temperature and a drift amount according to a background art.

FIG. 17 is a diagram showing a circuit constitution of the CDMA terminal 20, numeral 31 in the drawing designates an antenna for executing a communication of the CDMA type with a nearby base station, and numeral 32 designates an RF portion connected to the antenna 31.

The RF portion 32 separates a signal inputted from the antenna 31 on a frequency axis by a duplexer in receiving, and converts a frequency thereof into an IF signal by mixing the signal with a local oscillating signal having a predetermined frequency outputted from a PLL synthesizer. Further, the RF portion 32 extracts only a receiving channel by a broad band BPF, makes a signal level of a desired receiving wave constant by an AGC amplifier and outputs the receiving wave to a modulating/demodulating portion 33 at a next stage.

On the other hand, in transmitting, the RF portion 32 is constituted to control a transmitting power of a modulating signal of offset quadri-phase shift keying (OQPSK) transmitted from the modulating/demodulating portion 33 by an AGC amplifier based on a control from a controller 40, thereafter, convert a frequency thereof to an RF band by mixing with the local oscillating signal having the predetermined frequency outputted from the PLL synthesizer, amplify the power to a large power by a power amplifier (PA) and transmit the signal from the antenna 31 via the duplexer.

Further, in receiving, the modulating/demodulating portion 33 separates the IF signal from the RF portion 32 to a base band in-phase quadrature-phase (I·Q) by an orthogonal detector, digitizes the signal at a sample rate of about 10 [MHz] and outputs the signal to a CDMA portion 34 at a next stage.

On the other hand, in transmitting, the modulating/demodulating portion 33 is constituted to make the I·Q signal having a digital value transmitted from the CDMA portion 34 analog at a sample rate of about 5 [MHz] and thereafter subject the signal to the OQPSK modulation by the orthogonal detector to output to the RF portion 32.

Further, in receiving, the CDMA portion 34 inputs a digital signal from the modulating/demodulating portion 33 to a timing extracting circuit of a pseudo noise code (PN) and a plurality of demodulating circuits for inversely diffusing/demodulating the signal in accordance with an instruction of the timing extracting circuit and synthesizes the signal by a synthesizer by synchronizing with a plurality of modulating symbols outputted therefrom to output to a voice processing portion 35 at a next stage.

On the other hand, in transmitting, the CDMA portion 34 is constituted to process to diffuse an output symbol from the voice processing portion 35 and thereafter restrict a band thereof by a digital filter to constitute the I·Q signal to output to the modulating/demodulating portion 33.

Further, in receiving, the voice processing portion 35 deinterleaves the output symbol from the CDMA portion 34, subjects the output symbol to an error correcting processing by a viterbi demodulator, thereafter decompress a digital signal compressed by a voice processing digital signal processor (DSP) to a normal digital voice signal and makes the digital voice signal analog to drive a speaker (SP) 36 to emit loud voice.

On the other hand, in transmitting, the voice processing portion 35 is constituted to digitize an analog voice signal inputted from a microphone (MIC) 37, thereafter compress the voice signal to ⅛ or smaller by a voice processing DSP to form it into an error correcting code by a convolutional coder to interleave and output the output symbol to the CDMA portion 34.

Further, numeral 38 in the drawing designates an antenna for GPS and the antenna 38 is connected with a GPS receiver 39.

The GPS receiver 39 constitutes the GPS unit 23 shown in FIG. 16 integrally with the antenna 38. Further, the GPS receiving portion 39 demodulates a GPS radio wave of a center frequency of 1.57542 [GHz] from at least 3, preferably 4 or more of GPS satellites received by the antenna 38 by inversely diffusing a content thereof subjected to spectrum diffusion respectively by a PN code referred to as a C/A code, and calculates a current position (latitude/longitude/height) in a three-dimensional space and current time by the signals and outputs a result calculated in this way to the controller 40.

The GPS receiving portion 39 is constructed by a constitution as shown by FIG. 1 and is provided with TCO 16 as the temperature sensor. Further, according to a reference frequency at inside of the GPS receiver, a drift value is measured by the reference frequency of GPS.

Further, the controller 40 is connected to the RF portion 32, the modulating/demodulating portion 33, the CDMA portion 34, the voice processing portion 35 and the GPS receiving portion 39, and the controller 40 is connected with the display portion 21, the camera potion 22, the magnetism sensor 24 and the gyro sensors 25 and 26 as shown in FIG. 16.

Here, the controller 40 is constituted by CPU, ROM, RAM and the like, and controls a total of the terminal based on a predetermined operational program stored to ROM, and ROM is fixedly stored with operation programs and the like for control in communication and control of transmitting and receiving communication data, display control at the display portion 21, a navigation program as well as operation program at the controller 40 including various controls for operating the CDMA terminal 20.

Further, a record medium for storing the above-described programs is not limited to ROM, mentioned above, but may be a magnetic or an optical storage medium, or a storage medium of a semiconductor memory other than ROM, a hard disk, CD-ROM, a memory card or the like.

Further, the programs stored to the record medium may be constructed by a constitution for receiving a portion or a total thereof via a network. Further, the record medium may be a record medium of a server constructed on a network.

Further, RAM provided at the controller 40 includes a work area for temporarily storing various data and a telephone book area for registering a set of a name and a telephone number of a counter party in use by the control by the controller 40 and in the telephone book area, a stored content is held regardless of a state of inputting a power source of the CDMA terminal 20 by power source backing up.

As described above, the CDMA terminal 20 is provided with a key input portion, and the key input portion 41 includes a dial key serving also as a character input key, a "talk" key, a "cut" key, redialing key, a mode selecting key, a cursor key, a shutter key and the like. Further, an operating signal thereof is directly inputted to the controller 40.

Further, the CDMA terminal 20 is provided with a memory 42 for storing various data or application programs downloaded via a telephone network (communication network), a photographed image provided by the camera portion 22 and the like.

Further, the camera portion 22 is constituted by an image taking portion, an optical lens and a solid image taking element of CCD or the like, and when an optical image of an object focused on an image taking face of the solid image taking element by the optical lens is read by the photographing portion in the form of an analog signal, the photographing portion digitizes the analog signal and thereafter subjects the signal to a predetermined color processing and thereafter outputs the signal to the controller 40.

Further, the gyro sensor is a sensor for detecting a rotational angular velocity and includes an oscillator for generating basic oscillation. Further, the gyro sensor utilizes the fact that when a mass oscillating in a certain direction is accompanied by an angular velocity, an oscillation is generated also in a direction orthogonal thereto by an Coriolis effect and is constituted to calculate a rotational angular velocity of a body by detecting a Coriolis' force thereof.

Meanwhile, an oscillation number of the gyro sensor is provided with a temperature characteristic, and a frequency thereof is shifted by an aging change. When the frequency is shifted by a temperature change or an aging change in this way, there poses a problem that a sensor sensitivity becomes unstable.

Hence, in order to make the sensor sensitivity stable, it is necessary to compensate for a temperature by measuring drift values of frequencies of oscillating gyro sensors 25 and 26.

As described above, according to the reference frequency of inside of the GPS receiver, the drift value is measured by the reference frequency of GPS. Therefore, by comparing the reference frequency of inside of the GPS receiver and the frequency of oscillating the gyro sensor at each GPS positioning, the drift values of the frequencies of oscillating the gyro sensors 25, 26 relative to the TCO value can be measured.

When the drift values of the frequencies of oscillating the gyro sensors 25 and 26 can be measured the coefficients of the approximated polynomial representing the temperature frequency characteristic can be updated as in the first through the third embodiments, and amounts of drifts of the frequencies of oscillating of the gyro sensors 25, 26 can be corrected.

Specifically, an approximated polynomial representing a temperature frequency characteristic of a gyro sensor for testing is calculated and coefficients thereof are stored to the memory 42. Further, in GPS positioning, the reference frequency of inside of the GPS receiver and the frequency of oscillating of the gyro sensor are compared by the controller 40, and the drift values of the frequencies of oscillating the gyro sensors 25, 26 relative to the TCO value are measured. Next, by utilizing the measured drift values, the coefficients of the approximated polynomial stored to the memory 42 are updated based on the temperature frequency characteristic updating processing shown in the first through the third embodiments.

When the angular velocity is detected by the gyro sensor, the frequency in correspondence with the current temperature is detected by firstly reading the coefficients of the approximated polynomial updated as described above and successively reading the frequency of TCO, not illustrated, provided at a vicinity of the gyro sensor. Further, the drift value of the frequency of oscillating of the gyro sensor is predicted by using the coefficients of the approximated polynomial and the current TCO value.

By correcting the oscillating frequency based on the drift value predicted in this way, the detection accuracy can be promoted by stabilizing the sensor sensitivities of the gyro sensors 25 and 26.

In this way, according to the above-described fourth embodiment, in the portable terminal having the GPS function utilizing the gyro sensor, by comparing the reference frequency of inside of the GPS receiver and the frequency of oscillating of the gyro sensor, the drift value of the frequency of oscillating of the gyro sensor relative to the TCO value can be measured and the temperature frequency characteristic of the gyro sensor can automatically be compensated for.

Further, the coefficients of the polynomial representing the temperature characteristic of the frequency of oscillating of the gyro sensor previously stored to the memory are updated for each GPS positioning and therefore, a change in the temperature frequency characteristic by an aging change or the like can accurately be followed while using the gyro sensor, and accuracy of predicting the drift value of the oscillating frequency can be promoted.

Further, although according to the above-described fourth embodiment, an explanation has been given of the case of predicting the drift value of the frequency of oscillating of the gyro sensor based on the reference frequency of inside of the GPS receiver, the invention is not limited thereto but the drift value of the frequency of oscillating of the gyro sensor may be measured based on an oscillating frequency of PLL or VCO (either of which is not illustrated) at a CDMA terminal after synchronizing a carrier with a base station.

Further, although according to the above-described respective embodiments, an explanation has been given of a case in which the oscillating means is provided with a temperature dependency, the invention is not limited thereto but when an oscillating frequency of an oscillator is provided with a dependency on a physical amount of a pressure, a humidity, a gravitational force, an acceleration or the like other than the temperature, the physical amounts may be detected by physical amount detecting means of a pressure sensor, a humidity sensor, a gravitational force sensor, an acceleration sensor and the like.

Further, although according to the above-described respective embodiments, an explanation has been given of the case in which the oscillating means of the case in which the oscillating means is provided with the temperature dependency, the invention is not limited thereto but when an output of a current, a voltage or the like is provided with a dependency on a temperature, a characteristic of the temperature and the output may be represented by an approximated equation, and when the characteristic of the temperature and the output is changed by an aging change or the like, a change in the characteristic may be corrected by utilizing a measured value of the output.

INDUSTRIAL APPLICABILITY

According to the characteristic automatic compensating apparatus of the oscillator according to the invention, the coefficients of the approximated equation representing the temperature frequency characteristic of the reference oscillator can easily be calculated based on the set of the measured data of the temperature data and the frequency drift value, the coefficients are updated based on the measured drift value and the temperature data and therefore, the change in the temperature frequency characteristic by the aging change or the like can accurately be followed and the frequency drift value can be predicted always with high accuracy, which is convenient.

Further, the approximated equation representing the temperature frequency characteristic of the reference oscillator is represented by the polynomial and all the coefficients are updated and therefore, the change in the temperature frequency characteristic by the aging change or the like can accurately be followed, and the accuracy of predicting the frequency drift value can be promoted, which is convenient.

Further, with regard to outside of the detected temperature range, the drift value is calculated from the polynomial curve before updating, the coefficients of the polynomial curve are updated by using the calculated value and therefore, in comparison with a case of updating by using only data within the detected temperature range, a deterioration in the predicting accuracy of outside of the detected temperature range can be restrained, the memory can considerably be reduced and the problem of overflowing is not posed.

Further, according to the positioning signal receiver according to the invention, the previously determined coefficients of the approximated equation representing the temperature frequency characteristic of the oscillator are updated based on the measured drift value and the temperature data provided by positioning and therefore, the change in the temperature frequency characteristic by the aging change or the like can accurately be followed, and the frequency drift value can be predicted always with high accuracy, which is convenient.

The invention claimed is:

1. A characteristic automatic compensating apparatus of an oscillator comprising oscillating means for outputting an oscillating signal an oscillating frequency of which depends on a temperature, temperature detecting means for detecting the temperature of the oscillating means, characteristic determining means for measuring a drift value of the oscillating frequency of the oscillating means while changing the temperature and for previously determining a coefficient of an approximated equation representing a temperature frequency characteristic of the temperature detected by the temperature detecting means and the drift value of the oscillating frequency of the oscillating means, storing means for storing the coefficient of the approximated equation determined by the characteristic determining means, drift value predicting means for predicting the drift value of the oscillating frequency of the oscillating means based on the temperature detected by the temperature detecting means, and characteristic updating means for updating the coefficient of the approximated equation determined by the characteristic determining means by the measured drift value of the oscillating frequency of the oscillating means and the temperature detected by the temperature detecting means at a time point of the detection, wherein the characteristic determining means represents the approximated equation representing the characteristic of the temperature detected by the temperature detecting means and the drift value of the oscillating frequency of the oscillating means by a polynomial, and wherein the characteristic updating means updates all of the coefficients of the polynomial determined by the characteristic determining means by either one of the least squares method and the successive least squares method by dividing a temperature range at constant intervals with regard to a temperature range which is not detected by the temperature detecting means, calculating the drift value by the coefficient of the polynomial determined by the characteristic determining means for each divided temperature and forming a set of data of the temperature and the drift value, and using the provided set of the data and a set of data of the measured drift value of the oscillating frequency of the oscillating means and the temperature detected by the temperature detecting means at the time point of the detection.

2. The characteristic automatic compensating apparatus of an oscillator according to claim 1, wherein the temperature detecting means is a temperature compensating type oscillator.

3. The characteristic automatic compensating apparatus of an oscillator according to claim 1, wherein the characteristic determining means represents the approximated equation representing the characteristic of the temperature detected by the temperature detecting means and the drift value of the oscillating frequency of the oscillating means by the polynomial of a degree of 5 or more.

4. The characteristic automatic compensating apparatus of an oscillator according to claim 1, wherein the characteristic determining means represents the approximated equation representing the characteristic of the temperature detected by the temperature detecting means and the drift value of the oscillating frequency of the oscillating means by the polynomial by either of a least squares method and a successive least squares method.

5. The characteristic automatic compensating apparatus of an oscillator according to claim 1, wherein the characteristic determining means represents the approximated equation representing the characteristic of the temperature detected by the temperature detecting means and the drift value of the oscillating frequency of the oscillating means by the polynomial by a Kalman filter.

6. The characteristic automatic compensating apparatus of an oscillator according to claim 1, wherein the oscillating means includes a thermistor, a resistance value of which is changed by temperature, and a frequency thereof which is changed by temperature.

7. The characteristic automatic compensating apparatus of an oscillator according to claim 1, wherein the oscillating means is constituted by an oscillator of a gyro sensor.

8. The characteristic automatic compensating apparatus of an oscillator according to claim 7, wherein the measured drift value of the oscillating frequency of the oscillating means is measured based on a reference frequency of a global positioning system.

9. The characteristic automatic compensating apparatus of an oscillator according to claim 7, wherein the measured drift value of the oscillating frequency of the oscillating means is measured based on a carrier frequency of a base station of a portable telephone.

10. A characteristic automatic compensating apparatus of an oscillator comprising oscillating means for outputting an oscillating signal an oscillating frequency of which depends on a temperature, temperature detecting means for detecting the temperature of the oscillating means, characteristic determining means for measuring a drift value of the oscillating frequency of the oscillating means while changing the temperature and for previously determining a coefficient of an approximated equation representing a temperature frequency characteristic of the temperature detected by the temperature detecting means and the drift value of the oscillating frequency of the oscillating means, storing means for storing the coefficient of the approximated equation determined by the characteristic determining means, drift value predicting means for predicting the drift value of the oscillating frequency of the oscillating means based on the temperature detected by the temperature detecting means, and characteristic updating means for updating the coefficient of the approximated equation determined by the characteristic determining means by the measured drift value of the oscillating frequency of the oscillating means and the temperature detected by the temperature detecting means at a time point of the detection, wherein the characteristic determining means represents the approximated equation representing the characteristic of the temperature detected by the temperature detecting means and the drift value of the oscillating frequency of the oscillating means by a polynomial, and wherein the characteristic updating means updates all of the coefficients of the polynomial determined by the characteristic determining means by the Kalman filter by dividing a temperature range at constant intervals with regard to a temperature range which is not detected by the temperature detecting means, forming a set of data of the temperature and the drift value by calculating the drift value by the coefficient of the polynomial determined by the characteristic determining means for each divided temperature, and using the provided set of the data and a set of data of the measured drift value of the oscillating frequency of the oscillating means and the temperature detected by the temperature detecting means at the time point of the detection.

11. The characteristic automatic compensating apparatus of an oscillator according to claim 10, wherein the oscillating means is constituted by an oscillator of a gyro sensor.

12. The characteristic automatic compensating apparatus of an oscillator according to claim 11, wherein the measured drift value of the oscillating frequency of the oscillating means is measured based on a reference frequency of a global positioning system.

13. The characteristic automatic compensating apparatus of an oscillator according to claim 11, wherein the measured drift value of the oscillating frequency of the oscillating means is measured based on a carrier frequency of a base station of a portable telephone.

14. The characteristic automatic compensating apparatus of an oscillator according to claim 10, wherein the temperature detecting means is a temperature compensating type oscillator.

15. The characteristic automatic compensating apparatus of an oscillator according to claim 10, wherein the characteristic determining means represents the approximated equation representing the characteristic of the temperature detected by the temperature detecting means and the drift value of the oscillating frequency of the oscillating means by the polynomial of a degree of 5 or more.

16. The characteristic automatic compensating apparatus of an oscillator according to claim 10, wherein the characteristic determining means represents the approximated equation representing the characteristic of the temperature detected by the temperature detecting means and the drift value of the oscillating frequency of the oscillating means by the polynomial by either of a least squares method and a successive least squares method.

17. The characteristic automatic compensating apparatus of an oscillator according to claim 10, wherein the characteristic determining means represents the approximated equation representing the characteristic of the temperature detected by the temperature detecting means and the drift value of the oscillating frequency of the oscillating means by the polynomial by a Kalman filter.

* * * * *

UNITED STATES PATENT AND TRADEMARK OFFICE
CERTIFICATE OF CORRECTION

PATENT NO. : 7,548,130 B2
APPLICATION NO. : 10/547058
DATED : June 16, 2009
INVENTOR(S) : Michio Kobayashi Page 1 of 1

It is certified that error appears in the above-identified patent and that said Letters Patent is hereby corrected as shown below:

Title Page,
Add Item --(30) Foreign Application Priority Data
Mar. 17, 2003   (JP)   2003-072571
Oct. 15, 2003   (JP)   2003-354792--

Col. 14, Lines 64-65
" $\sum_{i=1}^{N} y_i \times x_i^k$ " should be -- $\sum_{i=1}^{N} y_i x_i^k$ --

Col. 17, Line 57
"$\{u_{k|y0},$" should be --$\{u_k|y_0,$--

Col. 27, Line 62, claim 7
after "is" delete "constituted by"

Signed and Sealed this

Twenty-ninth Day of September, 2009

David J. Kappos
*Director of the United States Patent and Trademark Office*